US012631955B2

(12) United States Patent
Kwon et al.

(10) Patent No.: US 12,631,955 B2
(45) Date of Patent: May 19, 2026

(54) METHOD OF CORRECTING AN ERROR OF A LAYOUT OF A PATTERN, METHOD OF MANUFACTURING A PHOTOMASK USING THE SAME, AND METHOD OF FORMING A PATTERN USING THE SAME

(71) Applicant: SAMSUNG ELECTRONICS CO., LTD., Suwon-si (KR)

(72) Inventors: Mijin Kwon, Anyang-si (KR); Seunghune Yang, Seoul (KR); Youngyeop Lee, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 586 days.

(21) Appl. No.: 17/938,138

(22) Filed: Oct. 5, 2022

(65) Prior Publication Data

US 2023/0194979 A1 Jun. 22, 2023

(30) Foreign Application Priority Data

Dec. 16, 2021 (KR) ........................ 10-2021-0180377

(51) Int. Cl.
*G03F 1/70* (2012.01)
*G03F 1/36* (2012.01)
*G06F 30/398* (2020.01)

(52) U.S. Cl.
CPC ................. *G03F 1/70* (2013.01); *G03F 1/36* (2013.01); *G06F 30/398* (2020.01)

(58) Field of Classification Search
CPC ..... G03F 1/70; G03F 1/36; G03F 1/76; G03F 1/72; G03F 7/70441; G06F 30/398
See application file for complete search history.

(56) References Cited

U.S. PATENT DOCUMENTS

| | | | |
|---|---|---|---|
| 7,321,680 B2 | 1/2008 | Ikeda et al. | |
| 7,324,930 B2 | 1/2008 | Cobb | |
| 7,849,423 B1 | 12/2010 | Yenikaya et al. | |
| 8,423,920 B2* | 4/2013 | Lee ........................ | G06F 30/39 |
| | | | 700/121 |

(Continued)

FOREIGN PATENT DOCUMENTS

KR 10-2017-0011554 A 2/2017

OTHER PUBLICATIONS

Office Action dated Oct. 20, 2025 issued in Korean Patent Application No. 10-2021-0180377 (Note: KR 10-2014-0145617 A and U.S. Pat. No. 9,696,150 B2 cited therein are already of record).

*Primary Examiner* — Nha T Nguyen
(74) *Attorney, Agent, or Firm* — MORGAN, LEWIS & BOCKIUS LLP

(57) ABSTRACT

A method of correcting an error of a layout of a pattern includes: designing a layout of a target pattern; checking an error between the layout of the target pattern and a layout of a real pattern in a photomask manufactured based on the layout of the target pattern; generating EPE vectors at a plurality of points, respectively, in a contour of the layout of the target pattern; calculating horizontal and vertical elements in horizontal and vertical directions, respectively, of each of the generated EPE vectors; calculating an offset representative value of the layout of the target pattern at each direction based on the calculated horizontal and vertical elements of the EPE vectors; and correcting the layout of the target pattern based on the offset representative value.

20 Claims, 31 Drawing Sheets

(56)     References Cited

U.S. PATENT DOCUMENTS

| | | | | |
|---|---|---|---|---|
| 9,696,150 | B2 | 7/2017 | Matsuoka | |
| 10,157,728 | B2 | 12/2018 | Tiphine et al. | |
| 10,223,494 | B2 | 3/2019 | Shin et al. | |
| 10,495,967 | B2 | 12/2019 | Huang et al. | |
| 10,534,255 | B2 | 1/2020 | Quaglio et al. | |
| 10,671,786 | B2 | 6/2020 | Lai et al. | |
| 2007/0079277 | A1* | 4/2007 | Golubtsov | G03F 1/36 |
| | | | | 716/52 |
| 2015/0146966 | A1* | 5/2015 | Weisbuch | G06T 5/50 |
| | | | | 382/145 |
| 2015/0228063 | A1* | 8/2015 | Minakawa | G06T 7/0002 |
| | | | | 382/151 |
| 2020/0103747 | A1 | 4/2020 | Huang et al. | |
| 2020/0124980 | A1* | 4/2020 | Shin | G03F 1/36 |
| 2021/0072637 | A1 | 3/2021 | Yeo et al. | |
| 2021/0116800 | A1* | 4/2021 | Kang | G03F 1/36 |
| 2021/0117604 | A1* | 4/2021 | Han | H01L 21/0274 |
| 2021/0216008 | A1* | 7/2021 | Du | G03F 1/36 |
| 2023/0185183 | A1* | 6/2023 | Hu | G03F 7/70441 |
| | | | | 430/5 |

* cited by examiner

FIG. 1

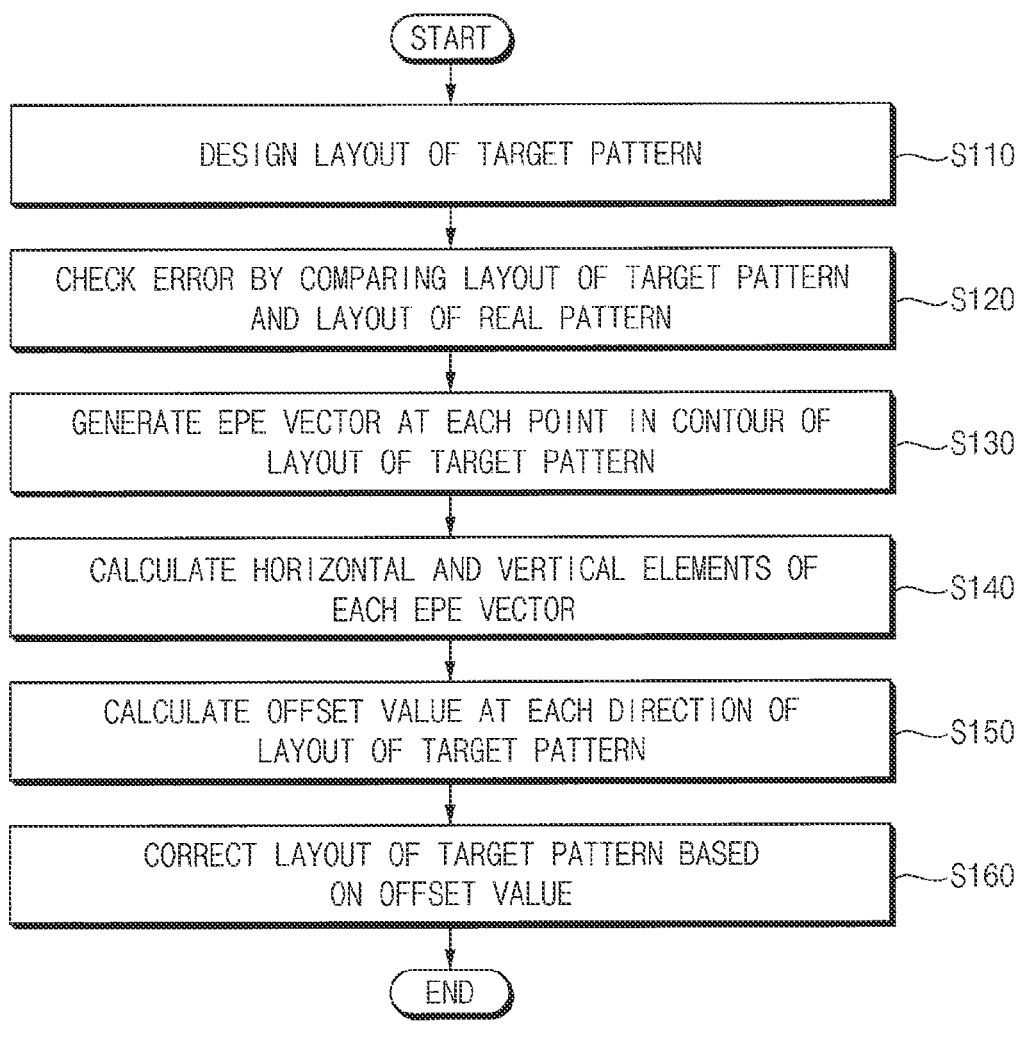

START

DESIGN LAYOUT OF TARGET PATTERN ~S110

CHECK ERROR BY COMPARING LAYOUT OF TARGET PATTERN
AND LAYOUT OF REAL PATTERN ~S120

GENERATE EPE VECTOR AT EACH POINT IN CONTOUR OF
LAYOUT OF TARGET PATTERN ~S130

CALCULATE HORIZONTAL AND VERTICAL ELEMENTS OF
EACH EPE VECTOR ~S140

CALCULATE OFFSET VALUE AT EACH DIRECTION OF
LAYOUT OF TARGET PATTERN ~S150

CORRECT LAYOUT OF TARGET PATTERN BASED
ON OFFSET VALUE ~S160

END

FIG. 3
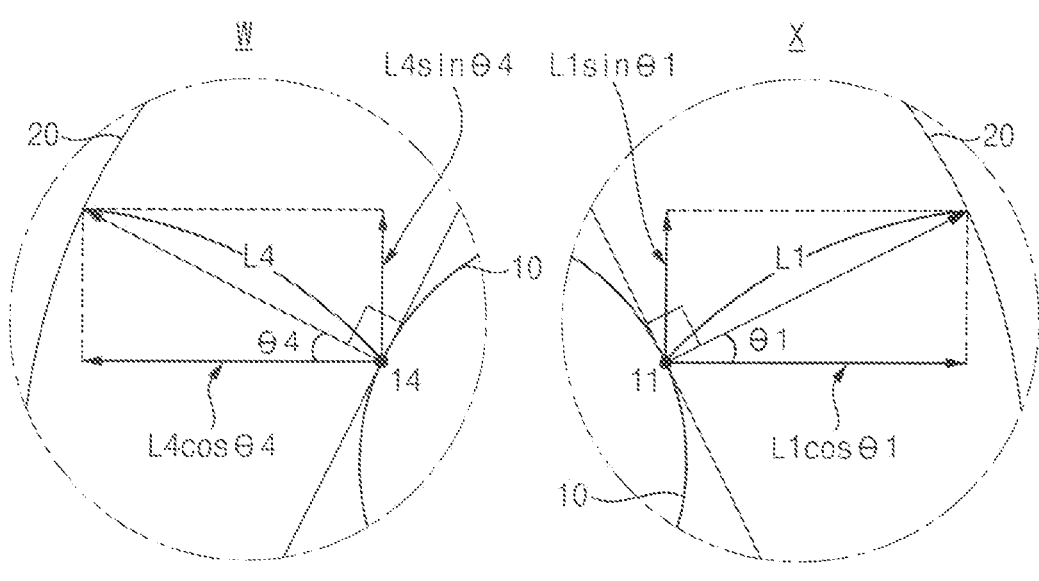
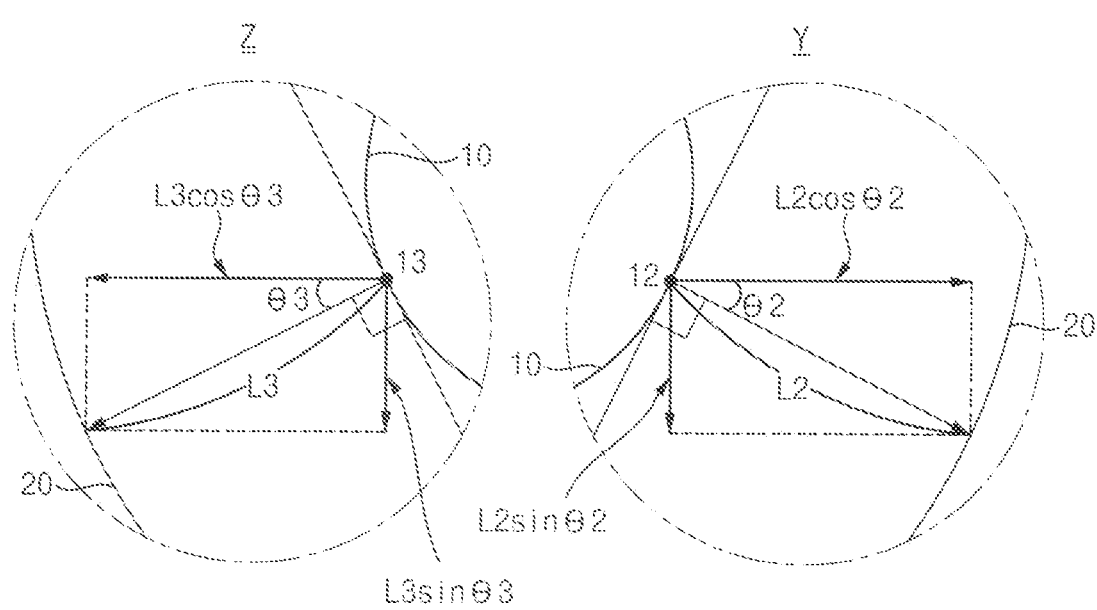

START

GENERATE EPE VECTOR AT EACH POINT IN CONTOUR
OF FIRSTLY CORRECTED LAYOUT OF PATTERN — S310

CALCULATE HORIZONTAL AND VERTICAL ELEMENTS OF
EACH EPE VECTOR — S320

CALCULATE OFFSET VALUE AT EACH DIRECTION OF FIRSTLY
CORRECTED LAYOUT OF PATTERN — S330

SECONDLY CORRECT FIRSTLY CORRECTED LAYOUT OF PATTERN
BASED ON OFFSET VALUE — S340

END

FIG. 10

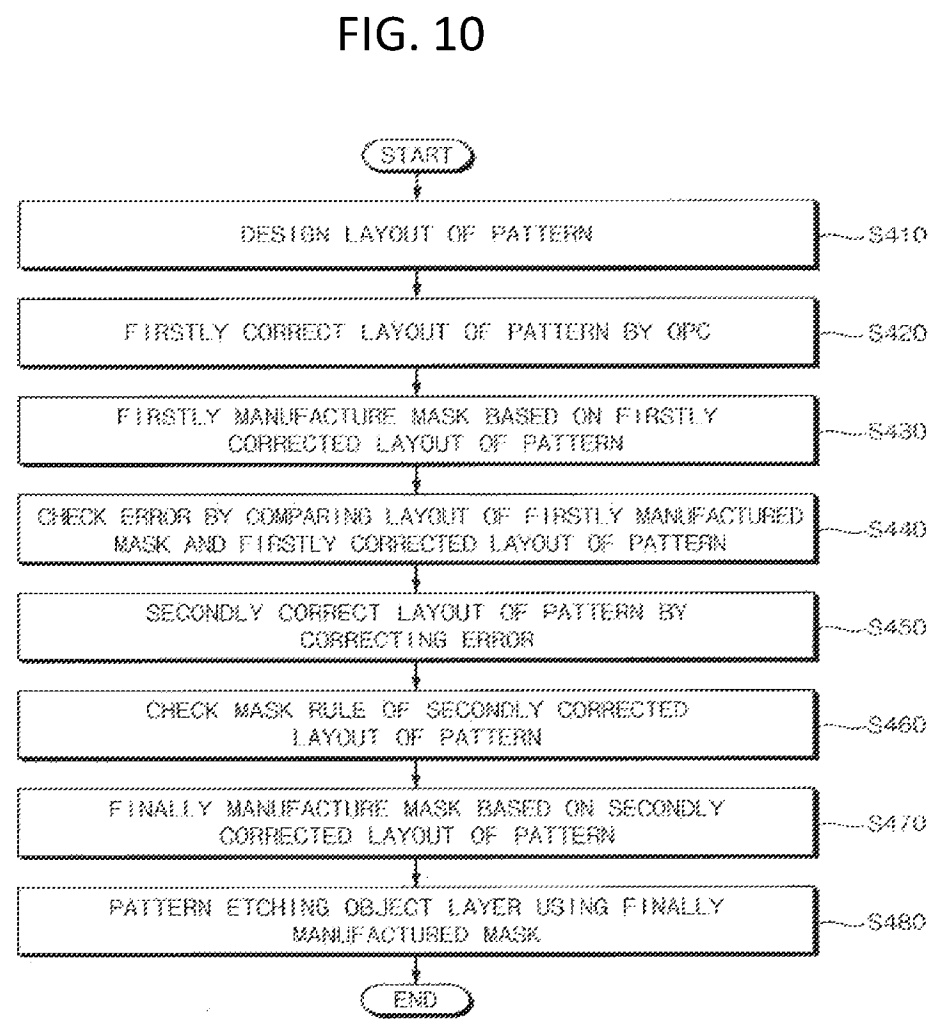

START

DESIGN LAYOUT OF PATTERN —— S410

FIRSTLY CORRECT LAYOUT OF PATTERN BY OPC —— S420

FIRSTLY MANUFACTURE MASK BASED ON FIRSTLY CORRECTED LAYOUT OF PATTERN —— S430

CHECK ERROR BY COMPARING LAYOUT OF FIRSTLY MANUFACTURED MASK AND FIRSTLY CORRECTED LAYOUT OF PATTERN —— S440

SECONDLY CORRECT LAYOUT OF PATTERN BY CORRECTING ERROR —— S450

CHECK MASK RULE OF SECONDLY CORRECTED LAYOUT OF PATTERN —— S460

FINALLY MANUFACTURE MASK BASED ON SECONDLY CORRECTED LAYOUT OF PATTERN —— S470

PATTERN ETCHING OBJECT LAYER USING FINALLY MANUFACTURED MASK —— S480

END

FIG. 13
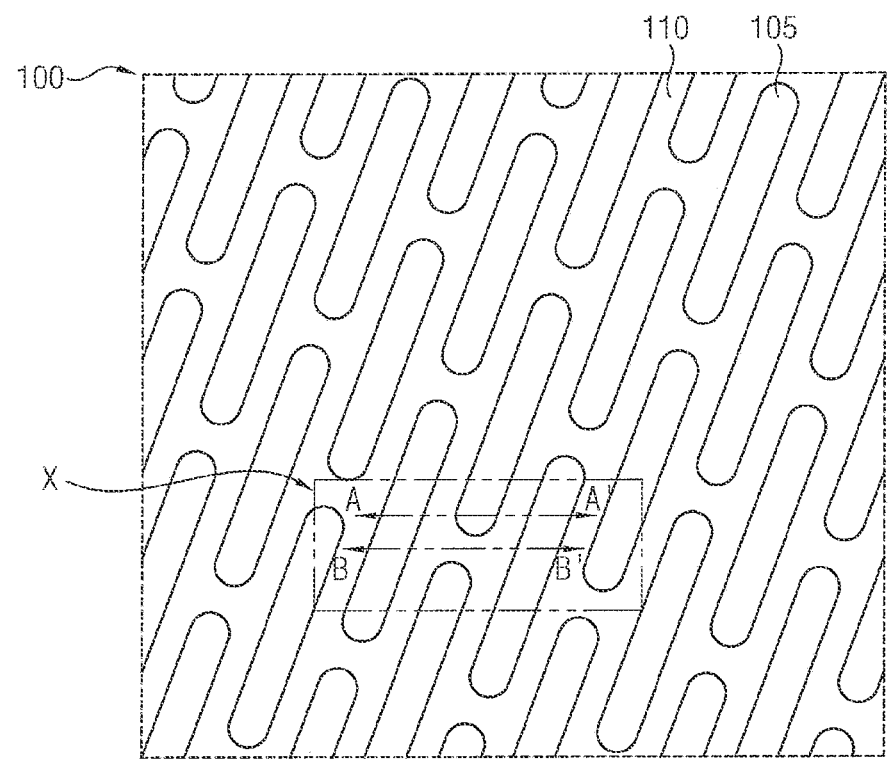
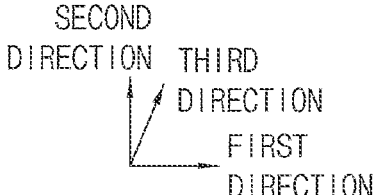

FIG. 16
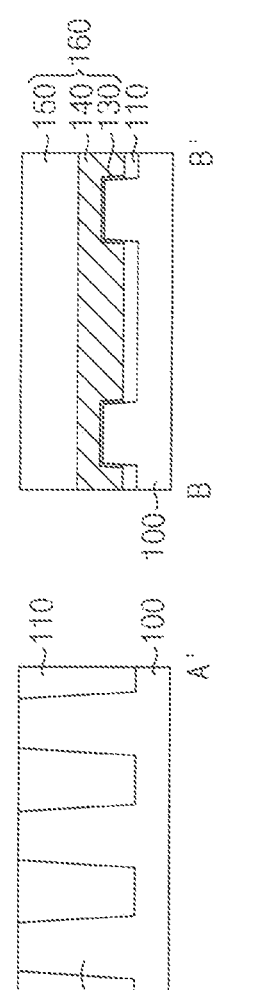
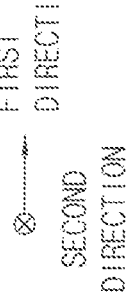

FIG. 18
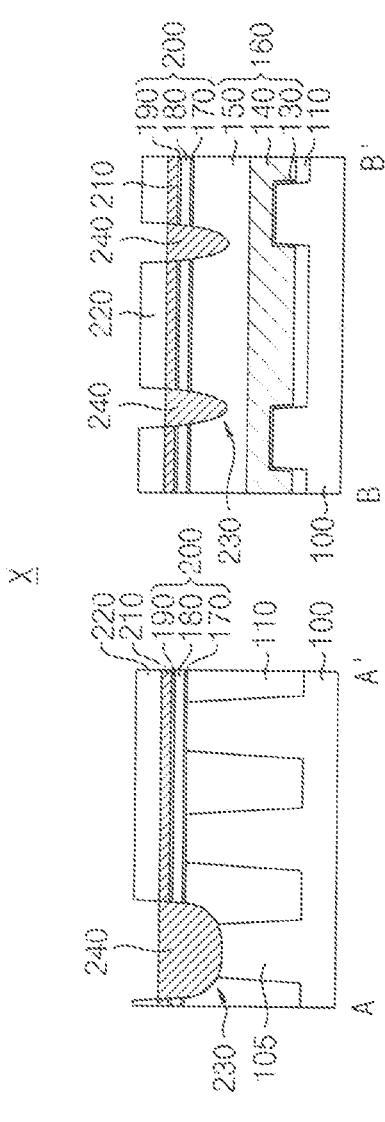
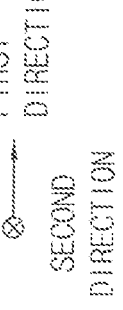
FIRST DIRECTION
SECOND DIRECTION

FIG. 19
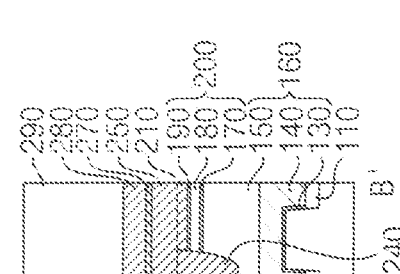
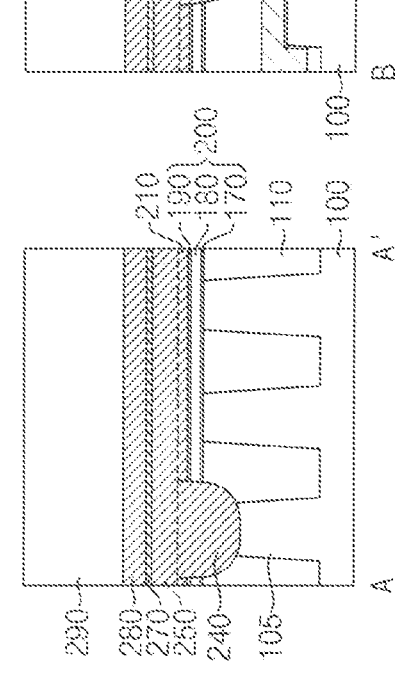

SECOND
DIRECTION
THIRD
DIRECTION
FIRST
DIRECTION

FIRST DIRECTION

SECOND DIRECTION

FIRST DIRECTION

SECOND DIRECTION

SECOND
DIRECTION
THIRD
DIRECTION
FIRST
DIRECTION

FIRST DIRECTION

SECOND DIRECTION

FIRST DIRECTION

SECOND DIRECTION

FIRST DIRECTION

SECOND DIRECTION

METHOD OF CORRECTING AN ERROR OF A LAYOUT OF A PATTERN, METHOD OF MANUFACTURING A PHOTOMASK USING THE SAME, AND METHOD OF FORMING A PATTERN USING THE SAME

CROSS-REFERENCE TO RELATED APPLICATION

This U.S. non-provisional patent application claims priority under 35 U.S.C. § 119 to Korean Patent Application No. 10-2021-0180377 filed on Dec. 16, 2021 in the Korean Intellectual Property Office, the disclosure of which is incorporated by reference in its entirety herein.

TECHNICAL FIELD

Example embodiments of the present disclosure relate to a method of correcting an error of a layout of a pattern, a method of manufacturing a photomask using the same, and a method of forming a pattern using the same.

DISCUSSION OF RELATED ART

An integrated circuit layout is the representation of an integrated circuit in terms of planar geometric shapes that corresponds to patterns of metal, oxide or semiconductor layers that make up components of the integrated circuit. The geometric shapes are typically linear shapes.

The sizes of lengths and widths of a target pattern having one of these linear shapes may be checked, and a layout of the target pattern may be corrected by performing an optical proximity correction (OPC) based on the size check. A photomask may then be manufactured based on the corrected layout of the target pattern.

However, when the geometric shape is a curved shape, a critical dimension (CD) error or an overlay error between the layout of the target pattern and the layout drawn in the photomask may remain after the OPC is performed.

SUMMARY

At least one example embodiment provides an enhanced method of correcting an error of a layout of a pattern.

At least one example embodiment provides an enhanced method of manufacturing a photomask.

At least one example embodiment provides an enhanced method of forming a pattern.

According to an example embodiment of the inventive concept, there is provided a method of correcting an error of a layout of a pattern. In the method, a layout of a target pattern is designed. An error between the layout of the target pattern and a layout of a real pattern in a photomask manufactured based on the layout of the target pattern is checked. EPE vectors are generated at a plurality of points, respectively, in a contour of the layout of the target pattern. Horizontal and vertical elements in horizontal and vertical directions, respectively, of each of the generated EPE vectors are calculated. An offset representative value of the layout of the target pattern is calculated at each direction based on the calculated horizontal and vertical elements of the EPE vectors. The layout of the target pattern is corrected based on the offset representative value.

According to an example embodiment of the inventive concept, there is provided a method of manufacturing a photomask. In the method, a layout of a pattern is designed. An OPC is performed on the layout to generate a first corrected layout of the pattern. A photomask is manufactured based on the first corrected layout of the pattern. An error between the first corrected layout of the pattern and a layout of a real pattern in the first photomask is checked. The first corrected layout of the pattern is corrected based on a result of the checking to generate a second corrected layout. A second photomask is manufactured based on the second corrected layout of the pattern. The correcting includes generating EPE vectors at a plurality of points, respectively, in a contour of the first corrected layout of the pattern, calculating horizontal and vertical elements in horizontal and vertical directions, respectively, of each of the generated EPE vectors; calculating an offset representative value of the layout of the pattern at each direction based on the calculated horizontal and vertical elements of the EPE vectors; and correcting the first corrected layout based on the offset representative value.

According to an example embodiment of the inventive concepts, there is provided a method of forming a pattern. In the method, a layout of a pattern is designed. An OPC is performed on the layout to generate a first corrected layout. A first photomask is manufactured based on the first corrected layout of the pattern. An error between the first corrected layout of the pattern and a layout of a real pattern in the firstly photomask manufactured based on the first corrected layout of the pattern is checked. The first corrected layout of the pattern is corrected using a result of the checking to generate a second corrected layout. A second photomask is manufactured based on the second corrected layout of the pattern. An etching object layer on a substrate is patterned using the second photomask to form the pattern on the substrate. The correcting includes, generating EPE vectors at a plurality of points, respectively, in a contour of the first corrected layout of the pattern, calculating horizontal and vertical elements in horizontal and vertical directions, respectively, of each of the generated EPE vectors, calculating an offset representative value of the layout of the pattern at each direction based on the calculated horizontal and vertical elements of the EPE vectors, and correcting the first corrected layout of the pattern based on the offset representative value.

In a method of correcting the error of the layout of the pattern according to at least one embodiment, not only a layout of a pattern having a linear shape but also a layout of a pattern having a curved shape may be precisely corrected.

BRIEF DESCRIPTION OF THE DRAWINGS

FIG. 1 is a flowchart illustrating a method of correcting an error between a layout of a target pattern and a layout of a real pattern according to an example embodiment.

FIGS. 2 to 7 are plan views illustrating the error correction method according to an example embodiment.

FIG. 10 is a flowchart illustrating a method of forming a pattern in accordance with an example embodiment.

FIGS. 13 to 31 are plan views and cross-sectional views illustrating a method of manufacturing a semiconductor device in accordance with example embodiments.

DETAILED DESCRIPTION

Figure 2:
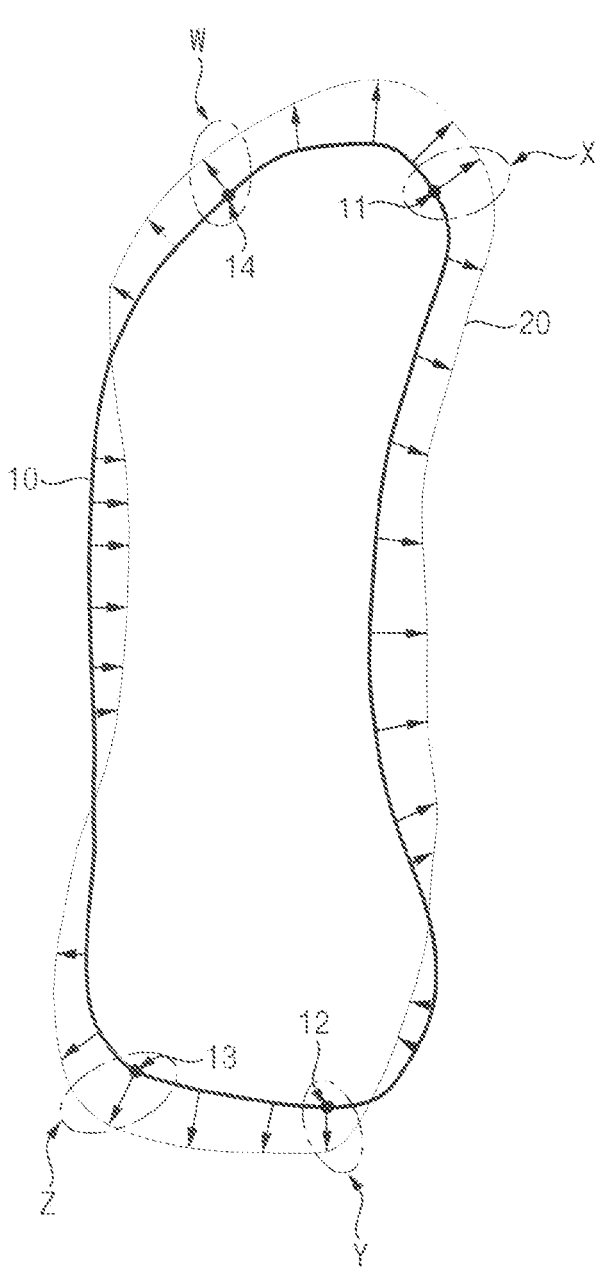

The above and other aspects and features of a gate structure and a method of forming the same, and a semiconductor device including the gate structure and a method of manufacturing the same in accordance with example embodiments will become readily understood from the detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are merely used to distinguish one element, component, region, layer or section from another region, layer or section. Thus, a first element, component, region, layer or section discussed below could be termed a second or third element, component, region, layer or section without departing from the inventive concept.

Patterns on a wafer may be formed by forming an etching object layer on the wafer, forming a photoresist layer on the etching object layer, patterning the photoresist layer to form a photoresist pattern, and etching the etching object layer using the photoresist pattern as an etching mask. An etching mask layer may be further formed between the etching object layer and the photoresist layer. In this case, the etching mask layer may be etched using the photoresist pattern to form an etching mask, and the etching object layer may be etched using the etching mask.

The formation of the photoresist pattern by patterning the photoresist layer may be performed by placing a photomask (e.g., a reticle on which a layout of a given pattern is drawn) over the photoresist layer, performing an exposure process in which a light is emitted from a light source to penetrate through the photomask, and performing a developing process in which a portion of the photoresist layer exposed or unexposed by the light is removed, so that the layout of the given pattern may be transferred to the photoresist layer.

For example, the light source may be a deep ultraviolet (DUV) equipment using KrF or ArF or an extreme ultraviolet (EUV) equipment. By using the EUV equipment, patterns having a minute pitch or a curved shape may be formed.

As the sizes of the patterns formed on a wafer decrease, an optical proximity effect (OPE) may occur due to the effect of neighboring patterns during the exposure process. An optical proximity correction (OPC) in which the layout of the patterns drawn in a photomask such as a reticle is corrected may be performed so as to solve the OPE.

The OPC may be performed at a chip level by the unit of a chip on a wafer, or at a shot level by the unit of a plurality of chips covered by one shot in an exposure equipment. The OPC may be performed by adding a hammer head or a serif to a layout of patterns in order to solve the corner rounding that may occur at a corner of each pattern during the exposure process.

A layout of a pattern that may be formed by etching an etching object layer using a photoresist pattern as an etching mask may not be entirely the same as a layout of the photoresist pattern due to the characteristics of the etching process or misalignment in the etching process. Thus, the layout of the photoresist pattern should be corrected so that a final pattern on a wafer may have a desired layout in consideration of the characteristics of the etching process or the process margin.

A photomask used in an exposure process may be manufactured by designing a layout of a target pattern, performing an OPC to correct the designed layout of the target pattern, and drawing or forming the target pattern having the corrected layout. However, a critical dimension (CD) error or an overlay error may occur between the layout of the real pattern drawn or formed in the photomask and the layout of the target pattern. Thus the above errors need to be corrected.

If a pattern has a shape including only straight lines, the correction of the error may be performed by correcting sizes of length and width of the pattern and the overlay error. However, if a pattern has a shape including curved lines, precise error correction is not possible through the above correction. An error between a layout of a target pattern and a layout of a real pattern drawn in the photomask is measured, and a method of using the measured error in the correction of the layout of the target pattern is performed to manufacture a photomask including a pattern having a desired layout.

Hereinafter, a method of correcting an error of a layout of a pattern, a method of manufacturing a photomask using the same, and a method of forming a pattern using the same is specifically described.

FIG. 1 is a flowchart illustrating a method of correcting an error between a layout of a target pattern and a layout of a real pattern, and FIGS. 2 to 7 are plan views illustrating the error correction method.

Referring to FIGS. 1 and 2, in step S110, a layout of a target pattern 10 that is desired to be drawn in a photomask is designed.

The photomask may be initially manufactured according to the designed layout of the target pattern 10 to generate a layout of a real pattern 20 formed in the manufactured photomask. Thus, the target pattern 10 is what was intended and the real pattern 20 is what was actually manufactured.

In step S120, the layout of the target pattern 10 and the layout of the real pattern 20 are compared to each other to check for an error such as a CD error or an overlay error. For example, if the real pattern 20 has a same shape as the target pattern 10 and overlays the target pattern 10 at a same position, then there would be no error. When the shape of the real pattern 20 differs from the target pattern 10, a CD error may be present. When the position of the real pattern 20 differs from a position of the target pattern 10, an overlay error may be present.

In step S130, an edge placement error (EPE) vector is generated at each point among a plurality of selected points of a contour of the layout of the target pattern 10.

In an example embodiment, a plurality points spaced apart from each other by a given distance may be selected in the contour of the layout of the target pattern 10 to generate the selected points, and the EPE vector may be generated at each of the plurality of points.

In an example embodiment, the EPE vector is proportional to a normal vector that is orthogonal to a tangential line at each point. In an example embodiment, a direction of the EPE vector may is an opposite direction that is parallel to the normal vector. For example, the direction of the EPE vector may be a direction from the layout of the target pattern 10 to the layout of the real pattern 20. Alternatively, the direction of the EPE vector may be defined as a direction from the layout of the real pattern 20 to the layout of the target pattern 10. Hereinafter, the direction of the EPE vector is defined as the former one.

A magnitude of the EPE vector may be defined as a distance from the layout of the target pattern 10 to the layout of the real pattern 20 at each point.

Likewise, the EPE vector may be defined at each of the plurality of points selected in the contour of the layout of the target pattern 10. FIG. 2 shows first, second, third and fourth points 11, 12, 13 and 14.

Referring to FIGS. 1 and 3, in step S140, a horizontal element and a vertical element of each EPE vector is calculated.

In an example embodiment, a magnitude of the horizontal element of each EPE vector is calculated from a magnitude of the EPE vector multiplied by a cosine of an angle between the EPE vector and the horizontal direction. Additionally, a direction of the horizontal element of each EPE vector may be defined as one of opposite directions included in the horizontal direction, which may have an acute angle with respect to a direction of each EPE vector.

Likewise, a magnitude of the vertical element of each EPE vector may be calculated from the magnitude of the EPE vector multiplied by a cosine of an angle between the EPE vector and the vertical direction or the magnitude of the EPE vector multiplied by a sine of the angle between the EPE vector and the horizontal direction. Additionally, a direction of the vertical element of each EPE vector may be defined as one of opposite directions included in the vertical direction, which may have an acute angle with respect to the direction of each EPE vector.

FIG. 3 shows the horizontal element and the vertical element of each of the EPE vectors defined at the first to fourth points 11, 12, 13 and 14.

That is, if a first EPE vector at the first point 11 has a magnitude of a first length L1 and forms an angle of θ1 with respect to the horizontal direction, a magnitude of a horizontal element of the first EPE vector is L1 cos(θ1), and a direction of the horizontal element of the first EPE vector is a right direction (e.g., +x direction). Additionally, a magnitude of a vertical element of the first EPE vector is L1 sin(θ1), and a direction of the vertical element of the first EPE vector is an upward direction (e.g., +y direction). The first EPE vector is located in a first quadrant, and thus may be divided into the right direction and the upward direction.

If a second EPE vector at the second point 12 has a magnitude of a second length L2 and forms an angle of θ2 with respect to the horizontal direction, a magnitude of a horizontal element of the second EPE vector is L2 cos(θ2), and a direction of the horizontal element of the second EPE vector is a right direction. Additionally, a magnitude of a vertical element of the second EPE vector is L2 sin(θ2), and a direction of the vertical element of the second EPE vector is a downward direction. The second EPE vector is located in a second quadrant, and thus may be divided into the right direction and the downward direction.

If a third EPE vector at the third point 13 has a magnitude of a third length L3 and forms an angle of θ3 with respect to the horizontal direction, a magnitude of a horizontal element of the third EPE vector is L3 cos(θ3), and a direction of the horizontal element of the third EPE vector is a left direction (e.g., a −x direction). Additionally, a magnitude of a vertical element of the third EPE vector is L3 sin(θ3), and a direction of the vertical element of the third EPE vector is a downward direction (e.g., a −y direction). The third EPE vector is located in a third quadrant, and thus may be divided into the left direction and the downward direction.

If a fourth EPE vector at the fourth point 14 has a magnitude of a fourth length L4 and forms an angle of θ4 with respect to the horizontal direction, a magnitude of a horizontal element of the fourth EPE vector is L4 cos(θ4), and a direction of the horizontal element of the fourth EPE vector is a left direction. Additionally, a magnitude of a vertical element of the fourth EPE vector is L4 sin(θ4), and a direction of the vertical element of the fourth EPE vector is an upward direction. The fourth EPE vector is located in a fourth quadrant, and thus may be divided into the left direction and the upward direction.

In step S150, an offset representative value is calculated at each direction of the layout of the target pattern 10.

In an example embodiment, the layout of the target pattern 10 include four directions, that is, a right direction, an upward direction, a right direction and a downward direction.

Thus, the offset representative value at each direction may be defined as a mean value at each direction of the EPE vectors at the selected points in the contour of the layout of the target pattern 10.

That is, an offset representative value at the right direction of the layout of the target pattern 10 may be defined as a sum of magnitudes of first ones of the EPE vectors located in the first quadrant or the second quadrant such as the first and second EPE vectors divided by the number of the first ones of the EPE vectors. For example, an offset representative value at the right direction may be generated by adding the horizontal elements in the right direction to generate a first sum and dividing the first sum by the number of the horizontal elements in the right direction. An offset representative value at the downward direction of the layout of the target pattern 10 may be defined as a sum of magnitudes of second ones of the EPE vectors located in the second quadrant or the third quadrant such as the second and third EPE vectors divided by the number of the second ones of the EPE vectors. For example, an offset representative value at the downward direction may be generated by adding the vertical elements in the downward direction to generate a second sum and dividing the second sum by the number of the vertical elements in the downward direction. An offset representative value at the left direction of the layout of the target pattern 10 may be defined as a sum of magnitudes of third ones of the EPE vectors located in the third quadrant or the fourth quadrant such as the third and fourth EPE vectors divided by the number of the third ones of the EPE vectors. For example, an offset representative value at the left direction may be generated by adding the horizontal elements in the left direction to generate a third sum and dividing the third sum by the number of the horizontal elements in the left direction. An offset representative value at the upward direction of the layout of the target pattern 10 may be defined as a sum of magnitudes of fourth ones of the EPE vectors located in the fourth quadrant or the first quadrant such as the fourth and first EPE vectors divided by the number of the fourth ones of the EPE vectors. For example, an offset representative value at the upward direction may be generated by adding the vertical elements in the upward direction to generate a fourth sum and dividing the fourth sum by the number of the vertical elements in the upward direction.

Referring to FIG. 1, in step S160, the layout of the target pattern 10 is corrected based on the offset representative value calculated in step S150.

That is, the layout of the target pattern 10 may be shifted in an opposite direction by the offset representative value at each direction. As illustrated above, if the direction of each EPE vector is defined as the direction from the layout of the target pattern 10 toward the layout of the real pattern 20 in the firstly manufactured photomask, the layout of the target pattern 10 may be shifted to an opposite direction to the direction of the EPE vector by the offset representative value at each direction.

Alternatively, if the direction of each EPE vector is defined as the direction from the layout of the real pattern 20 toward the layout of the target pattern 10, the layout of the target pattern 10 may be shifted to the same direction as the direction of the EPE vector by the offset representative value at each direction.

In an example embodiment, the correction of the layout of the target pattern 10 based on the offset representative value may be performed sequentially in order among the four directions, and only a corresponding portion of the layout of the target pattern 10 to each direction may be corrected.

For example, the four directions may include the right direction, the upward direction, the left direction and the downward direction, and portions of the layout of the target pattern 10 corresponding to the above directions, respectively, may be sequentially corrected. However, the inventive concept is not limited thereto, and the order of the corrections according to the four directions may be changed. For example, the offset representative value for the right direction may be a first distance to shift the layout of the target pattern in the left direction, the offset representative value for the left direction may be a second distance to shift the layout of the target pattern in the right direction, the offset representative value for the upward direction may be a third distance to shift the layout of the target pattern in the downward direction, and the offset representative value for the downward direction may be a fourth distance to shift the layout of the target pattern in the upward direction.

Hereinafter, an embodiment of a method of correcting the layout of the target pattern 10 based on the offset representative value is illustrated with reference to FIGS. 4 to 7.

Figure 4:
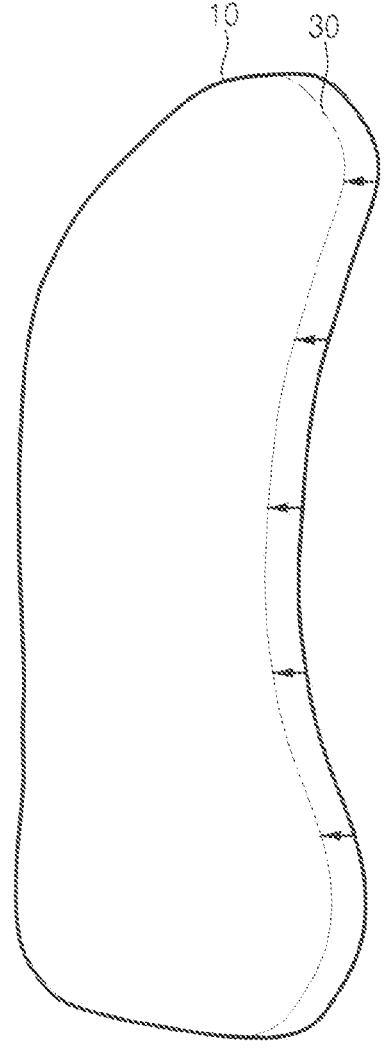

Referring to FIG. 4, a right portion of the layout of the target pattern 10 may be shifted in the left direction by an offset representative value at the right direction, so that a layout of a firstly corrected pattern 30 may be formed.

Figure 5:
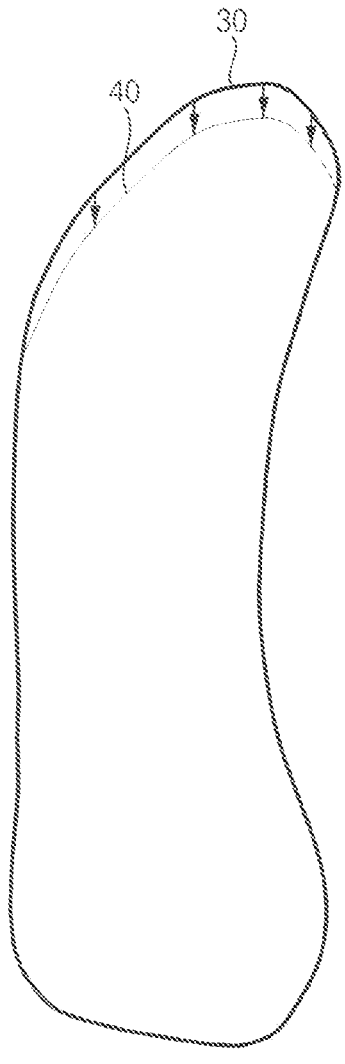

Referring to FIG. 5, an upper portion of the layout of the firstly corrected pattern 30 may be shifted in the downward direction by an offset representative value at the upward direction, so that a layout of a secondly corrected pattern 40 may be formed.

Figure 6:
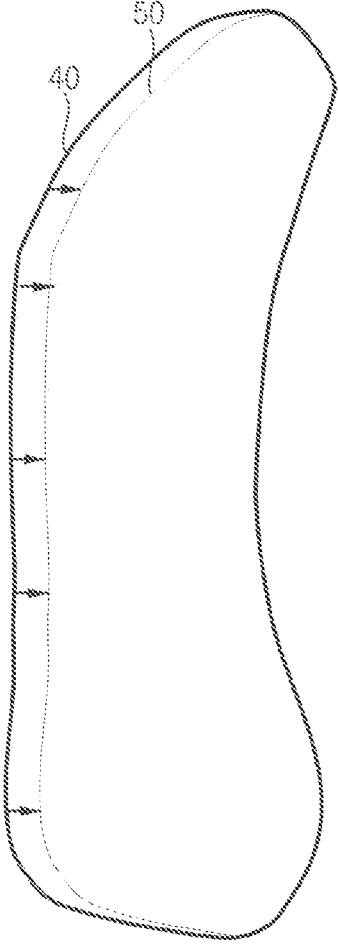

Referring to FIG. 6, a left portion of the layout of the secondly corrected pattern 40 may be shifted in the right direction by an offset representative value at the left direction, so that a layout of a thirdly corrected pattern 50 may be formed.

Figure 7:
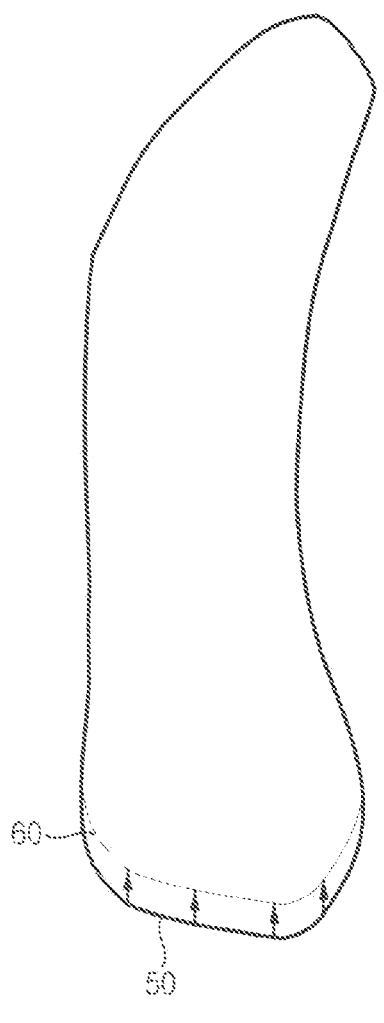

Referring to FIG. 7, a lower portion of the layout of the thirdly corrected pattern 50 may be shifted in the upward direction by an offset representative value at the downward direction, so that a layout of a final pattern 60 may be formed.

A photomask may be finally manufactured according to the layout of the final pattern 60 formed by the above method, and a layout of a real pattern drawn in the manufactured photomask may be similar to the initially designed layout of the target pattern 10. For example, the final pattern 60 may be the same as or similar to the initially intended target pattern 10.

As illustrated above, the correction of error between the layout of the target pattern 10 and the layout of the real pattern 20 may be performed by selecting points in the contour of the layout of the target pattern 10, generating the EPE vectors at the selected points, respectively, calculating the elements at each direction of the EPE vectors, determining the offset representative value at each direction (e.g., the mean value of the EPE vectors at each direction), and corrected the layout of the target pattern 10 using the offset representative values. Thus, when compared to error correction based on only sizes of the length and width, the error may be more exactly corrected. Further, the number of the points in the contour of the layout to those of the target pattern 10 may be adjusted so that the precision of the error correction may be controlled.

Figure 8:
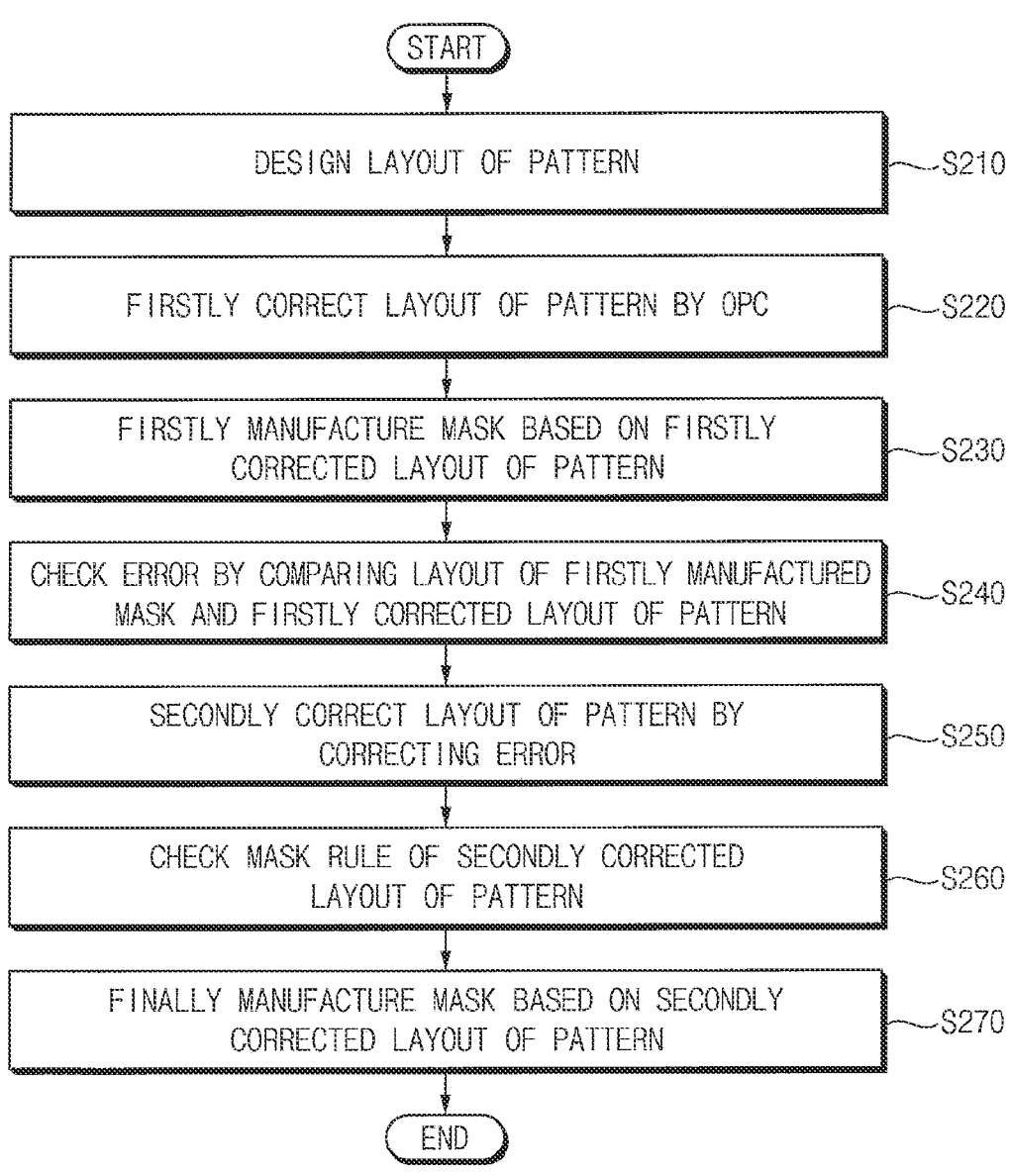
FIG. 8 is a flowchart illustrating a method of manufacturing a photomask in accordance with an example embodiment.
Figure 9:
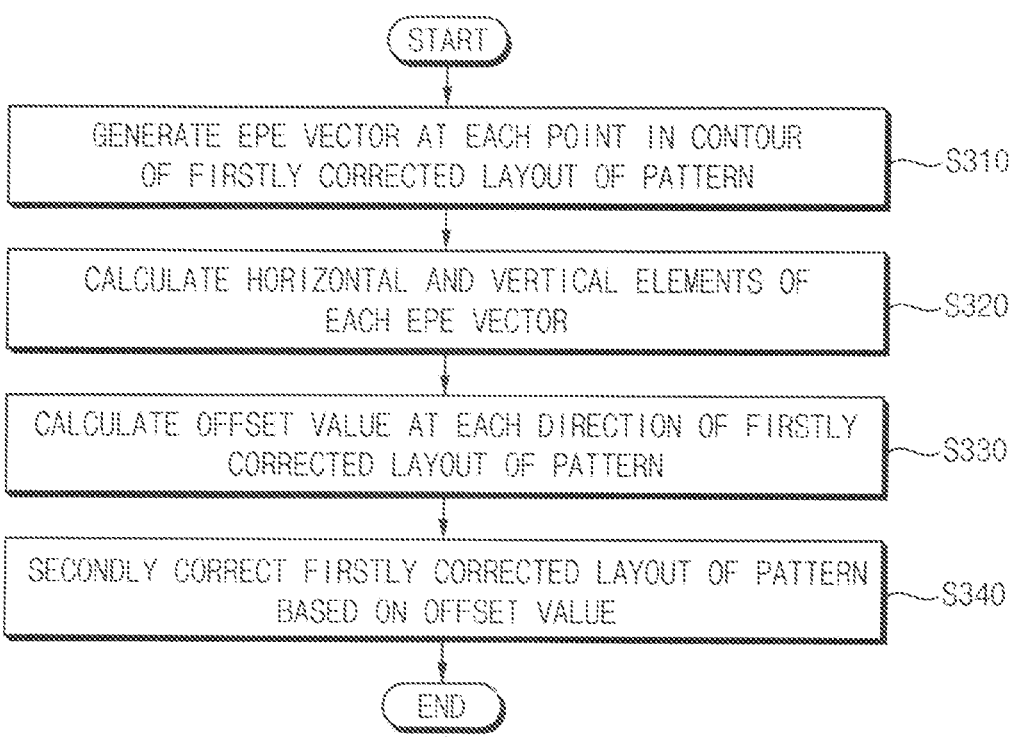
FIG. 9 is a flowchart illustrating a method of correcting an error of a layout of a pattern in accordance with an example embodiment.

FIG. 8 is a flowchart illustrating a method of manufacturing a photomask in accordance with an example embodiment, and FIG. 9 is a flowchart illustrating a method of correcting an error of a layout of a pattern in accordance with an example embodiment. This method may be based on the method of correcting the error between the layout of the target pattern and the layout of the real pattern, and thus repeated explanations thereof are omitted herein.

Referring to FIG. 8, in step S210, a layout of a pattern is designed, which may correspond to the designing of the layout of the target pattern in step S110.

In step S220, an OPC is performed so that the layout of the pattern is firstly corrected.

In step S230, a photomask is manufactured based on the firstly corrected layout of the pattern.

In step S240, the firstly corrected layout of the pattern and a layout of a pattern drawn in the firstly manufactured photomask is compared to each other so that an error is checked, which may correspond to the error checking by comparing the layout of the target pattern and the layout of the real pattern in step S120. For example, the error checking in step S240 may include steps S130-S150 of FIG. 1 to generate offset values at each direction based on the comparison.

In step S250, the firstly corrected layout of the pattern is secondly corrected, which may be illustrated with reference to FIG. 9. For example, the second correction may include shifting the firstly correct layout pattern in directions according to the offset values.

Referring to FIG. 9, in step S310, EPE vectors are generated at respective points in the contour of the firstly corrected layout of the pattern, which may correspond to step S130.

In step S320, horizontal and vertical elements of the EPE vectors at the respective points are calculated, which may correspond to step S140.

In step S330, an offset representative value is calculated at each direction of the firstly corrected layout of the pattern, which may correspond to step S140.

In step S340, the firstly corrected layout of the pattern is secondly corrected based on the calculated offset representative value, which may correspond to step S150.

In an embodiment, step 250 is implemented by performing the steps of FIG. 9.

Referring back to FIG. 8, in step S260, a mask rule check (MRC) may be performed on the secondly corrected layout of the pattern. If the secondly corrected layout of the pattern passes the MRC, the next step may be performed, while if the secondly corrected layout of the pattern does not pass the MRC, step S340 may be performed again.

In step S270, a final manufacturing of a photomask may be requested or performed based on the secondly corrected layout of the pattern.

That is, the initially designed layout of the pattern may be firstly and secondly corrected to generate designdata, which may be forwarded to the next step for finally manufacturing a real photomask.

In an embodiments, before performing step S230 to firstly manufacture the photomask based on the firstly corrected layout of the pattern, the firstly corrected layout of the pattern may be thirdly corrected based on data of secondly correcting the firstly corrected layout of a pattern having substantially the same shape as the above pattern.

That is, if data on the error correction about the pattern having the same shape as the layout of the present pattern is stored by performing designing, error check and error correction, an additional error correction may be performed using the data before firstly manufacturing the photo mask, so that the layout of the real pattern drawn in the photomask may be closer to a layout of a desired pattern.

Figure 11:
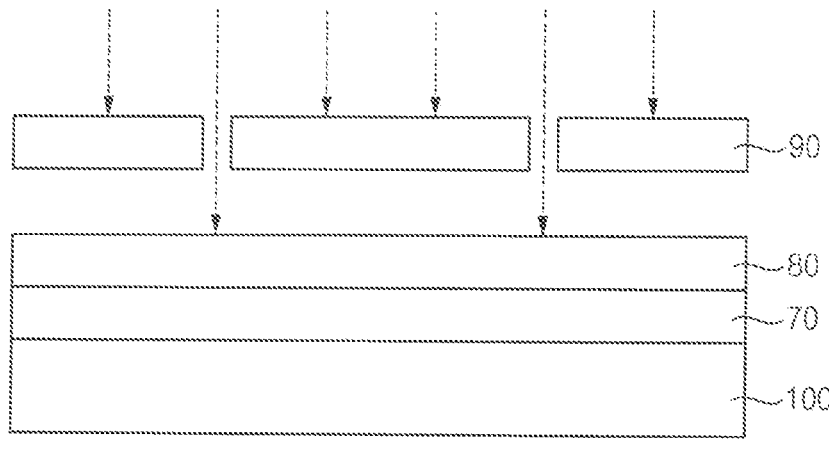
FIGS. 11 and 12 are cross-sectional views illustrating the method of FIG. 10 in accordance with an example embodiment.
Figure 12:
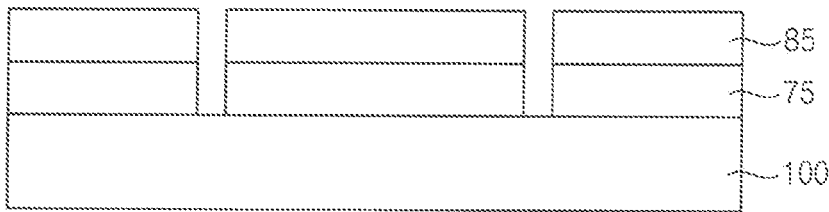

FIG. 10 is a flowchart illustrating a method of forming a pattern in accordance with an example embodiment, and FIGS. 11 and 12 are cross-sectional views illustrating the method. This method may be based on the method of manufacturing the photomask illustrated with reference to FIGS. 8 and 9, and thus repeated explanations thereof are omitted herein.

Referring to FIG. 10, in step 410, a layout of a pattern is designed.

In step S420, an OPC is performed to firstly correct the layout of the pattern.

In step S430, a photomask is manufactured based on the firstly corrected layout of the pattern.

In step S440, the firstly corrected layout of the pattern and a layout of a real pattern drawn in the firstly manufactured photomask are compared to each other to check for an error. The checking may include determining first offset values between the firstly corrected layout of the pattern and a layout of a real pattern drawn in four different directions.

In step S450, the error is corrected to secondly correct the layout of the pattern. For example, the second correction may be performed by shifting the firstly corrected layout pattern according to the first offset values.

In step S460, an MRC is performed on the secondly corrected layout of the pattern.

In step S470, a photomask is finally manufactured based on the secondly corrected layout of the pattern.

Referring to FIG. 11, in step S480, an etching object layer 70 may be patterned using the finally manufactured photomask 90 so that a pattern having a desired shape may be formed.

That is, the etching object layer 70 and a photoresist layer 80 may be sequentially formed on a substrate 100, and an exposure process and a developing process may be performed on the photoresist layer 80 using the photomask 90.

Referring to FIG. 12, the photoresist layer 80 may be transformed into a photoresist pattern 85 having a desired layout through the developing process, and the etching object layer 70 disposed on the substrate 100 may be etched using the photoresist pattern 85 as an etching mask to form a pattern 75 having a desired layout. The photoresist pattern 85 may be removed.

FIGS. 13 to 31 are plan views and cross-sectional views illustrating a method of manufacturing a semiconductor device in accordance with example embodiments. Particularly, FIGS. 13, 15, 17, 20, 24 and 30 are the plan views, and FIGS. 14, 16, 18-19, 21-23, 25-29 and 31 are the cross-sectional views.

FIGS. 15, 17, 20, 24 and 30 are enlarged plan views of region X, and each of FIGS. 14, 16, 18-19, 21-23, 25-29 and 31 includes cross-sections taken along lines A-A' and B-B' of a corresponding plan view.

This method may be performed using the method of correcting the layout of the pattern, the method of manufacturing the photomask using the same, and the method of forming the pattern using the same illustrated with reference to FIGS. 1 to 12, and thus repeated explanations thereof are omitted herein. Hereinafter, the above methods may be applied to the formation of active patterns 105, however, the inventive concept is not limited thereto, and may be applied to the formation of other structures.

Hereinafter, in the specification (and not necessarily in the claims), two directions substantially parallel to an upper surface of a substrate and substantially perpendicular to each other may be referred to as first and second directions, respectively, and a direction substantially parallel to the upper surface of the substrate and having an acute angle with respect to the first and second directions may be referred to as a third direction.

Figure 14:
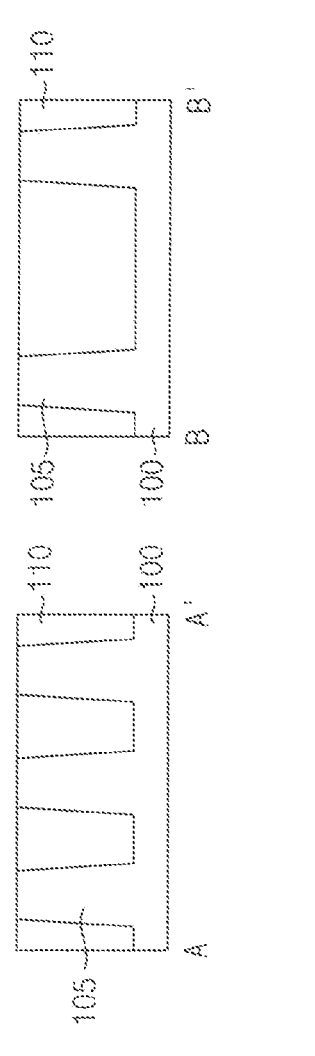

Referring to FIGS. 13 and 14, processes substantially the same as or similar to those illustrated with reference to FIGS. 11 and 12 may be performed.

Thus, the photoresist layer 80 may be formed on the substrate 100, and an exposure process and a developing process may be performed on the photoresist layer 80 using the photomask 90 to form the photoresist pattern 85. An upper portion of the substrate 100 using the photoresist pattern 85 as an etching mask may be used to form active patterns 105.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

An isolation pattern 110 may be formed on sidewalls of the active patterns 105.

Figure 15:
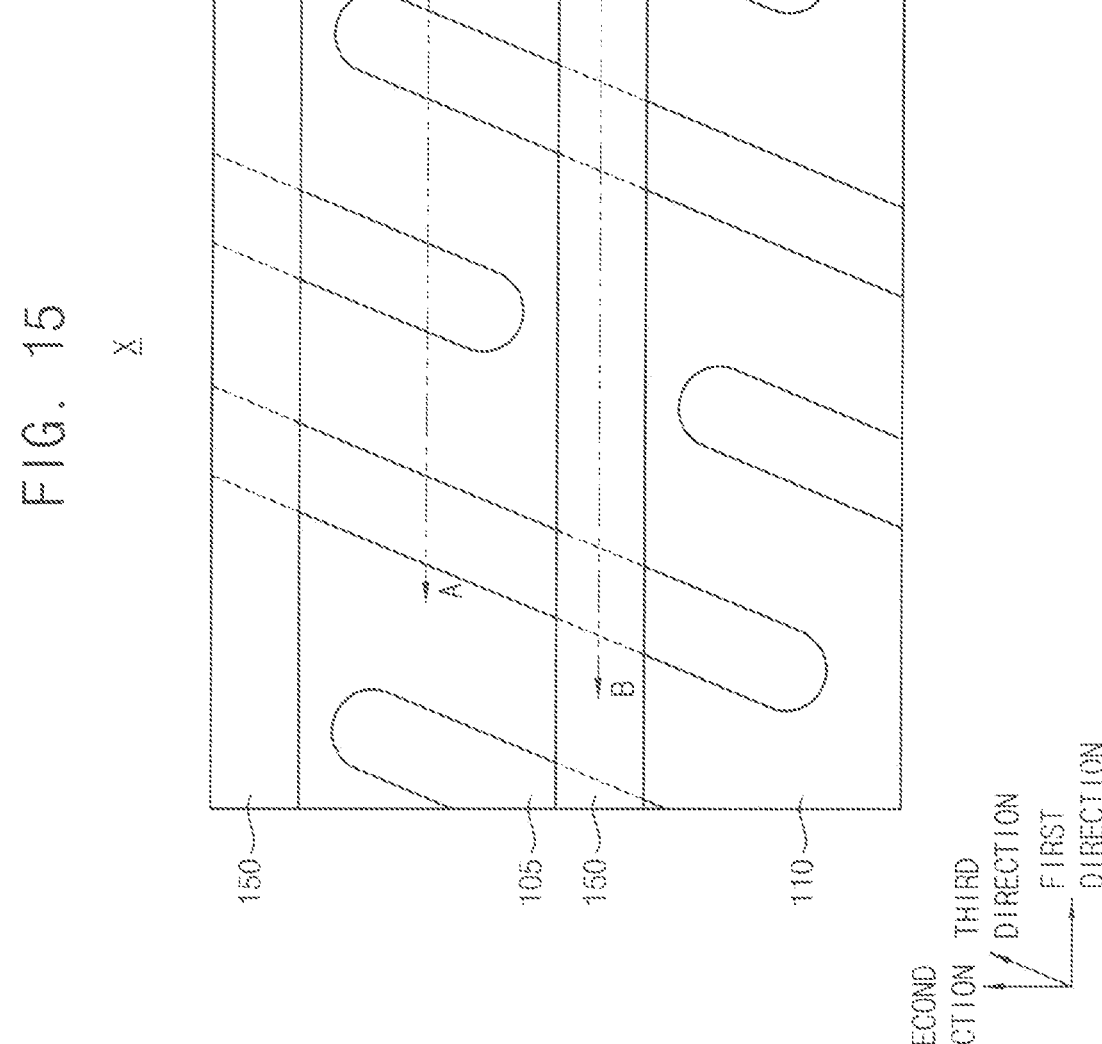

Referring to FIGS. 15 and 16, impurities may be implanted into an upper portion of the substrate 100 to form an impurity region, and the active pattern 105 and the isolation pattern 110 may be partially etched to form a first recess extending in the first direction.

A gate structure 160 may be formed in the first recess. The gate structure 160 may include a gate insulation pattern 130 disposed on a surface of the active pattern 105 exposed by the first recess, a gate electrode 140 filling a lower portion of the first recess, and a gate mask 150 disposed on the gate electrode 140 and filling an upper portion of the first recess. The gate structure 160 may extend in the first direction, and a plurality of gate structures 160 may be spaced apart from each other in the second direction.

The gate insulation layer 130 may be formed by thermally oxidizing the exposed surface of the active pattern 105 by the first recess.

Figure 17:
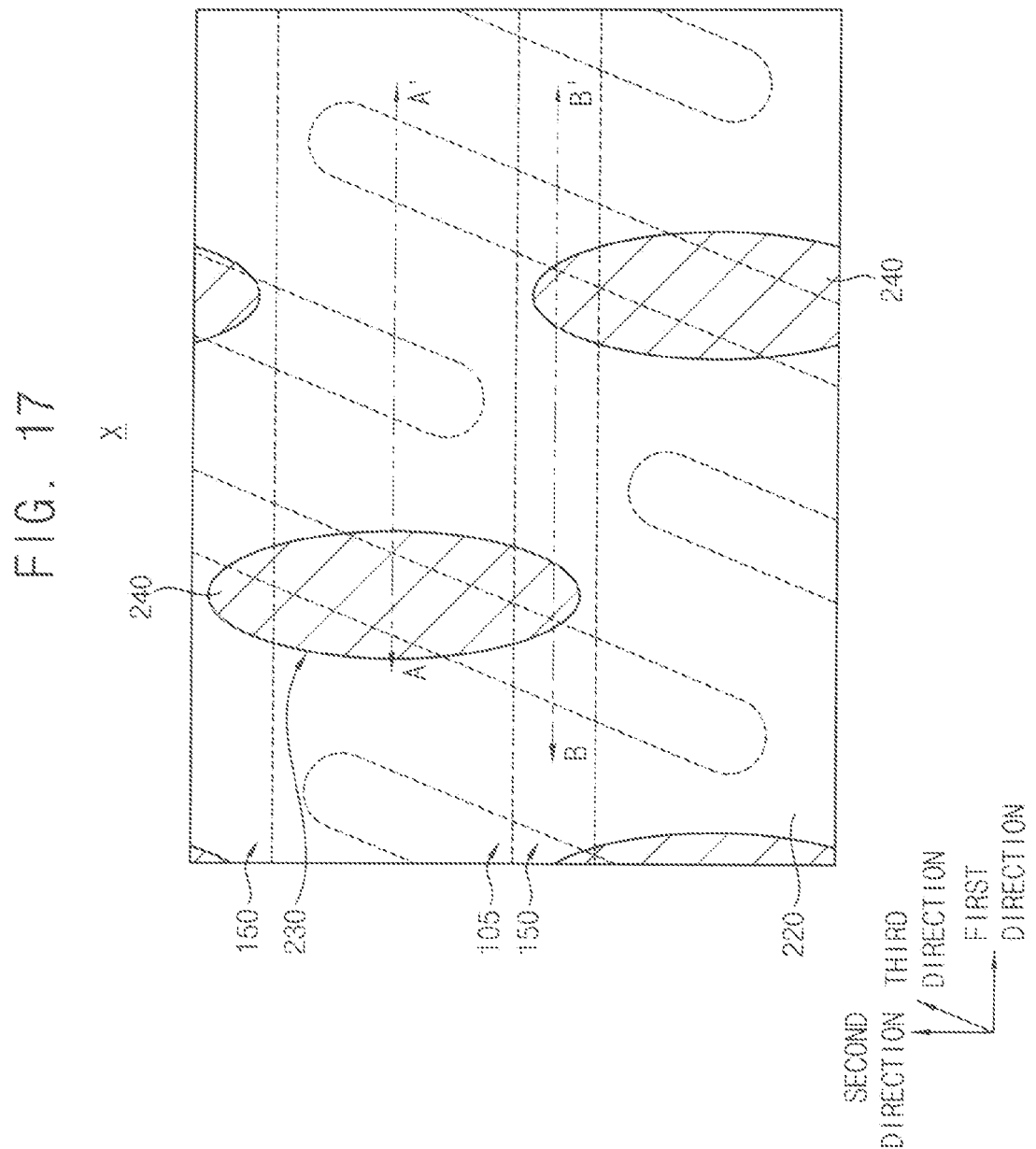

Referring to FIGS. 17 and 18, an insulation layer structure 200 may be formed on the active patterns 105 and the isolation pattern 110.

In an example embodiment, the insulation layer structure 200 may include first, second and third insulation layers 170, 180 and 190 sequentially stacked. Each of the first and third insulation layers 170 and 190 may include an oxide (e.g., silicon oxide) and the second insulation layer 180 may include a nitride (e.g., silicon nitride).

A first conductive layer 210 and a first mask 220 may be sequentially stacked on the insulation layer structure 200, and the first conductive layer 210 and the insulation layer structure 200 may be etched using the first mask 220 as an etching mask to form a first opening 230 exposing the active pattern 105.

The first conductive layer 210 may include (e.g., doped polysilicon) and the first mask 220 may include a nitride (e.g., silicon nitride).

During the etching process, an upper portion of the active pattern 105 exposed by the first opening 230, an upper portion of the isolation pattern 110 adjacent thereto, and an upper portion of the gate mask 150 may also be etched to form a second recess. That is, a bottom of the first opening 230 may be referred to as the second recess.

In an example embodiment, the first opening 230 may expose a central upper surface of each of the active patterns 105 extending in the third direction, and a plurality of first openings 230 may be formed in the first and second directions.

A second conductive layer 240 may be formed to fill the first opening 230.

In an example embodiment, the second conductive layer 240 may be formed by forming a preliminary second conductive layer disposed on the active pattern 105, the isolation pattern 110, the gate mask 150 and the first mask 220 to fill the first opening 230, and removing an upper portion of the preliminary second conductive layer. For example, the upper portion may be removed by a chemical-mechanical polishing (CMP) process and/or an etch back process.

In an example embodiment, a plurality of second conductive layers 240 are spaced apart from each other in the first and second directions. The second conductive layer 240 may include doped polysilicon as an example, and thus, in some cases, may be merged with the first conductive layer 210.

Referring to FIG. 19, after removing the first mask 220, a third conductive layer 250, a barrier layer 270, a first metal layer 280 may be sequentially stacked on the first and second conductive layers 210 and 240.

In an example embodiment, the third conductive layer 250 may include substantially the same material as the first and second conductive layers 210 and 240. That is, the third conductive layer 250 may include doped polysilicon, and thus, in some cases, may be merged with the first and second conductive layers 210 and 240. The barrier layer 270 may include a metal nitride (e.g., titanium nitride, tantalum nitride, tungsten nitride, etc.). The first metal layer 280 may include a metal (e.g., tungsten, titanium, tantalum, etc.).

A capping layer 290 may be formed on the first metal layer 280. The capping layer 290 may include a nitride such as silicon nitride.

Figure 20:
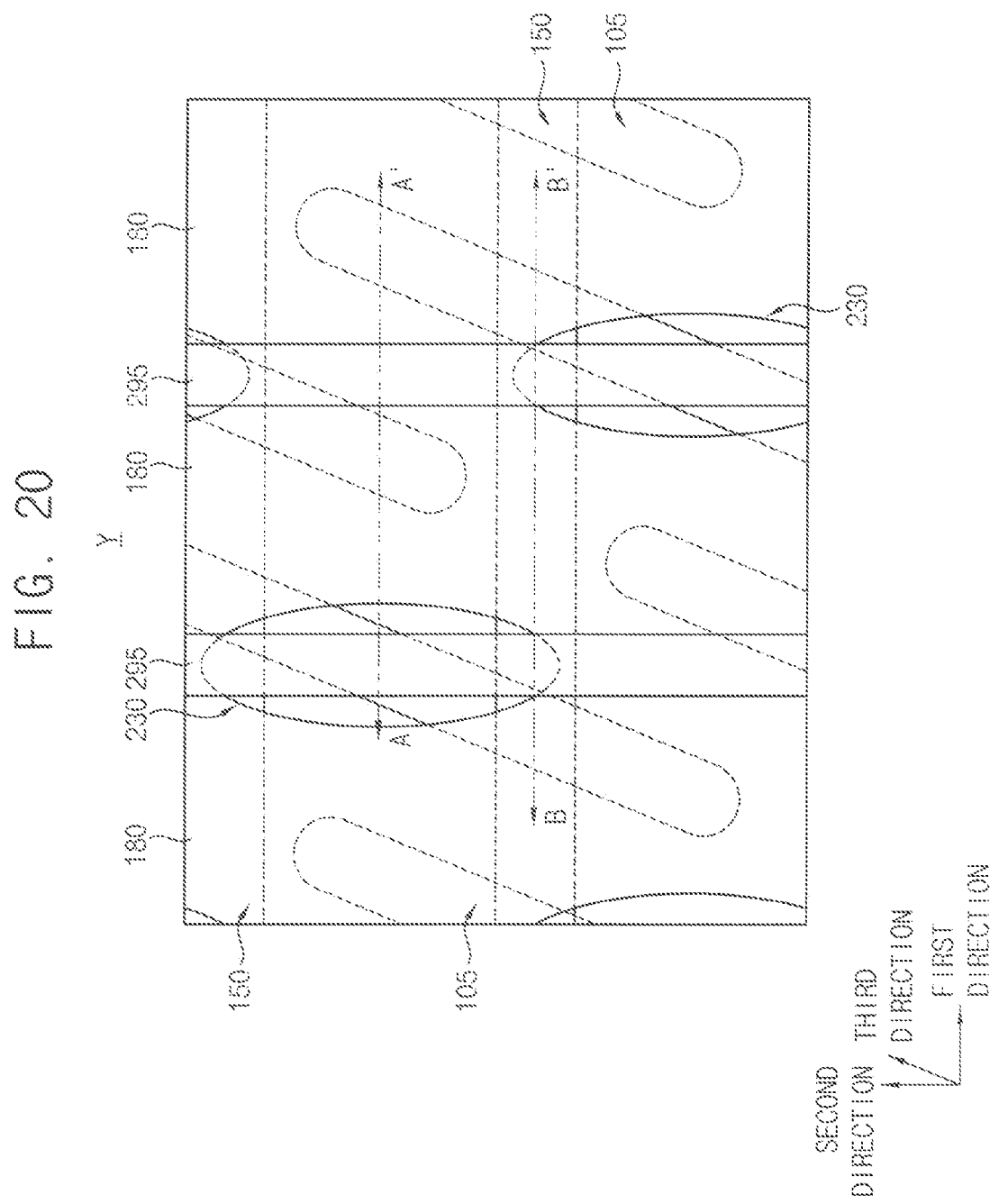
Figure 21:
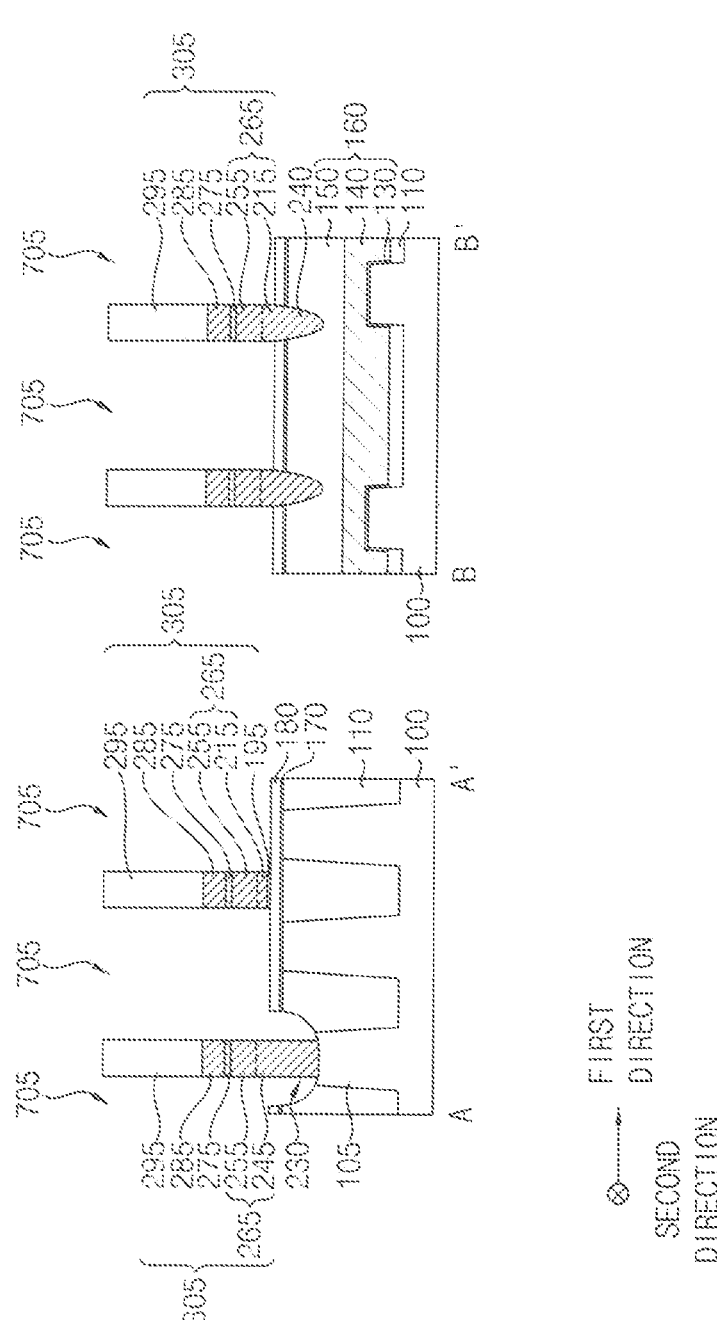

Referring to FIGS. 20 and 21, the capping layer 290 may be partially etched to form a first capping pattern 295, and the first metal layer 280, the barrier layer 270, the third conductive layer 250, the first and second conductive layers 210 and 240 and the third insulation layer 190 may be sequentially etched using the first capping pattern 295 as an etching mask.

In an example embodiment, the first capping pattern 295 may extend in the second direction, and a plurality of first capping patterns 295 may be spaced apart from each other in the first direction. By the etching process, a second conductive pattern 245, a third conductive pattern 255, a barrier pattern 275, a metal pattern 285 and the first capping pattern 295 sequentially stacked may be formed on the active pattern 105, the isolation pattern 110 and the gate mask 150 in the first opening 230, and a third insulation pattern 195, the first conductive pattern 215, the third conductive pattern 255, the barrier pattern 275, the metal pattern 285 and the first capping pattern 295 sequentially stacked may be formed on the second insulation layer 180 of the insulation layer structure 200 at an outside of the first opening 230.

As illustrated above, the first to third conductive layers 210, 240 and 240 may be merged with each other, and thus the second and third conductive patterns 245 and 255, and the first and third conductive patterns 215 and 255 each may form a conductive structure 265. Hereinafter, the conductive structure 265, the barrier pattern 275, the metal pattern 285 and the first capping pattern 295 sequentially stacked may be referred to as a bit line structure 305.

In an example embodiment, the bit line structure 305 may extend in the second direction, and a plurality of bit line structures 305 may be spaced apart from each other in the first direction.

A second opening 705 may be formed between neighboring ones of the bit line structures 305 in the first direction to extend in the second direction, and may expose an upper surface of the second insulation layer 180 to be connected to the first opening 230.

Figure 22:
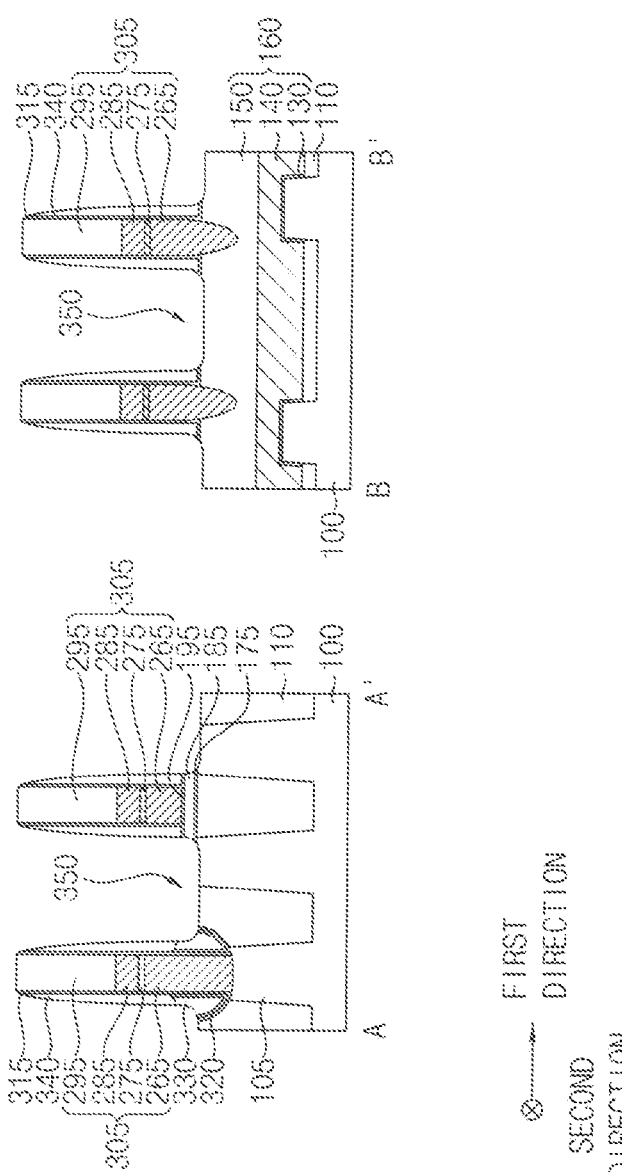

Referring to FIG. 22, a first spacer layer may be formed on the upper surfaces of the active pattern 105, the isolation pattern 110 and the gate mask 150 exposed by the first opening 230, a sidewall of the first opening 230 and the second insulation layer 180 to cover the bit line structure 305, and fourth and fifth insulation layers may be sequentially formed on the first spacer layer.

The first spacer layer may also cover a sidewall of the third insulation pattern 195 under a portion of the bit line structure 305 on the second insulation layer 180, and the fifth insulation layer may fill a remaining portion of the first opening 230.

The fourth and fifth insulation layers may be etched by an etching process. In an example embodiment, the etching process may be performed by a wet etching process, and other portions of the fourth and fifth insulation layers except for portions of the fourth and fifth insulation layers in the first opening 230 may be removed. Thus, most portions of a surface of the first spacer layer, that is, other portions of the first spacer layer except for the portion thereof in the first opening 230 may be exposed, and the portions of the fourth and fifth insulation layers remaining in the first opening 230 may form fourth and fifth insulation patterns 320 and 330, respectively.

A second spacer layer may be formed on the exposed surface of the first spacer layer and the fourth and fifth insulation patterns 320 and 330 in the first opening 230, and may be anisotropically etched to form a second spacer 340 on the surface of the first spacer layer and the fourth and fifth insulation patterns 320 and 330 to cover a sidewall of the bit line structure 305. The second spacer layer 340 may include an oxide such as silicon oxide.

A dry etching process may be performed using the first capping pattern 295 and the second spacer 340 as an etching mask to form a third opening 350 exposing an upper surface of the active pattern 105, and upper surfaces of the isolation pattern 110 and the gate mask 150 may also be exposed by the third opening 350.

By the dry etching process, a portion of the first spacer layer on the upper surfaces of the first capping pattern 295 and the second insulation layer 180 may be removed, and thus a first spacer 315 may be formed to cover the sidewall of the bit line structure 305. The first spacer 315 may include a nitride such as silicon nitride. Additionally, during the dry etching process, the first and second insulation layers 170 and 180 may be partially removed, and first and second insulation patterns 175 and 185 may remain under the bit line structure 305. The first to third insulation patterns 175, 185 and 195 sequentially stacked under the bit line structure 305 may form an insulation pattern structure.

Figure 23:
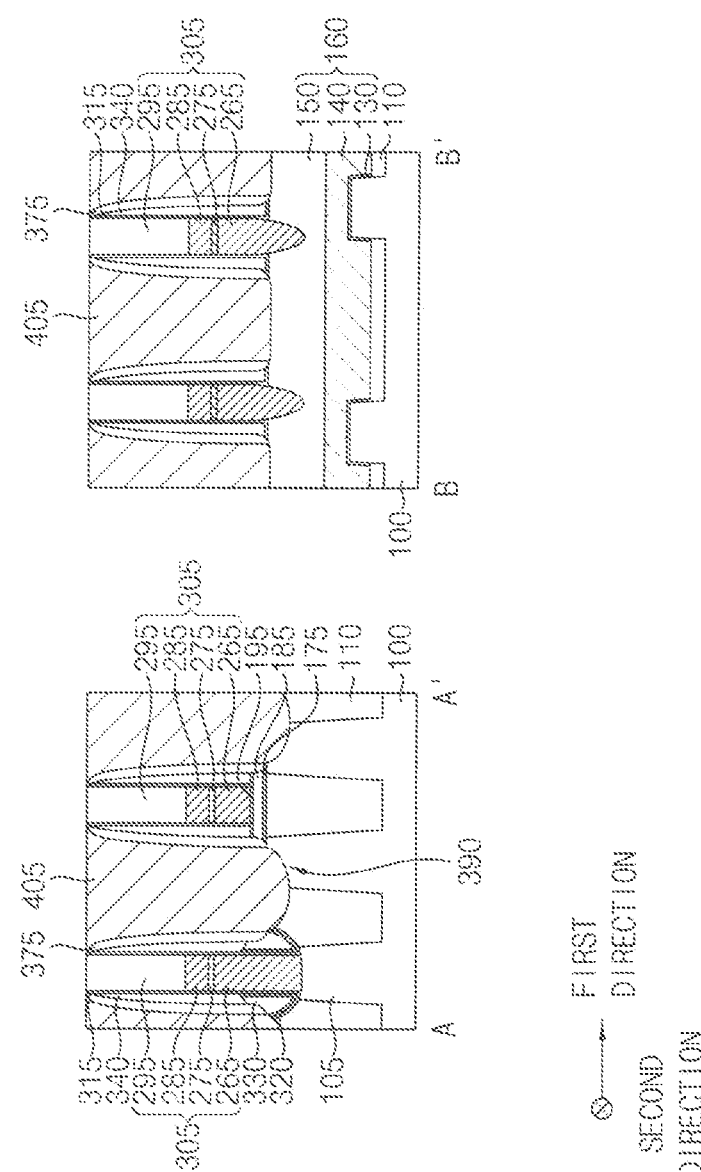

Referring to FIG. 23, a third spacer layer may be formed on the upper surface of the first capping pattern 295, an outer sidewall of the second spacer 340, portions of the upper surfaces of the fourth and fifth insulation patterns 320 and 330, and upper surfaces of the active pattern 105, the isolation pattern 110 and the gate mask 150 exposed by the third opening 350, and may be anisotropically etched to form a third spacer 375 covering the sidewall of the bit line structure 305. The third spacer 375 may include a nitride, e.g., silicon nitride.

The first to third spacers 315, 340 and 375 sequentially stacked on the sidewall of the bit line structure 305 in a horizontal direction substantially parallel to the upper surface of the substrate 100 may be referred to as a preliminary spacer structure.

An upper portion of the active pattern 105 may be etched to form a third recess 390 connected to the third opening 350.

A lower contact plug layer may be formed to fill the third opening 350 and the third recess 390. The lower contact plug layer may include doped polysilicon as an example.

The lower contact plug layer may be planarized until the upper surface of the first capping pattern 295 is exposed to form a lower contact plug 405 between the bit line structures 305.

In an example embodiment, the lower contact plug 405 may extend in the second direction, and a plurality of lower contact plugs 405 may be spaced apart from each other in the first direction.

Figure 24:
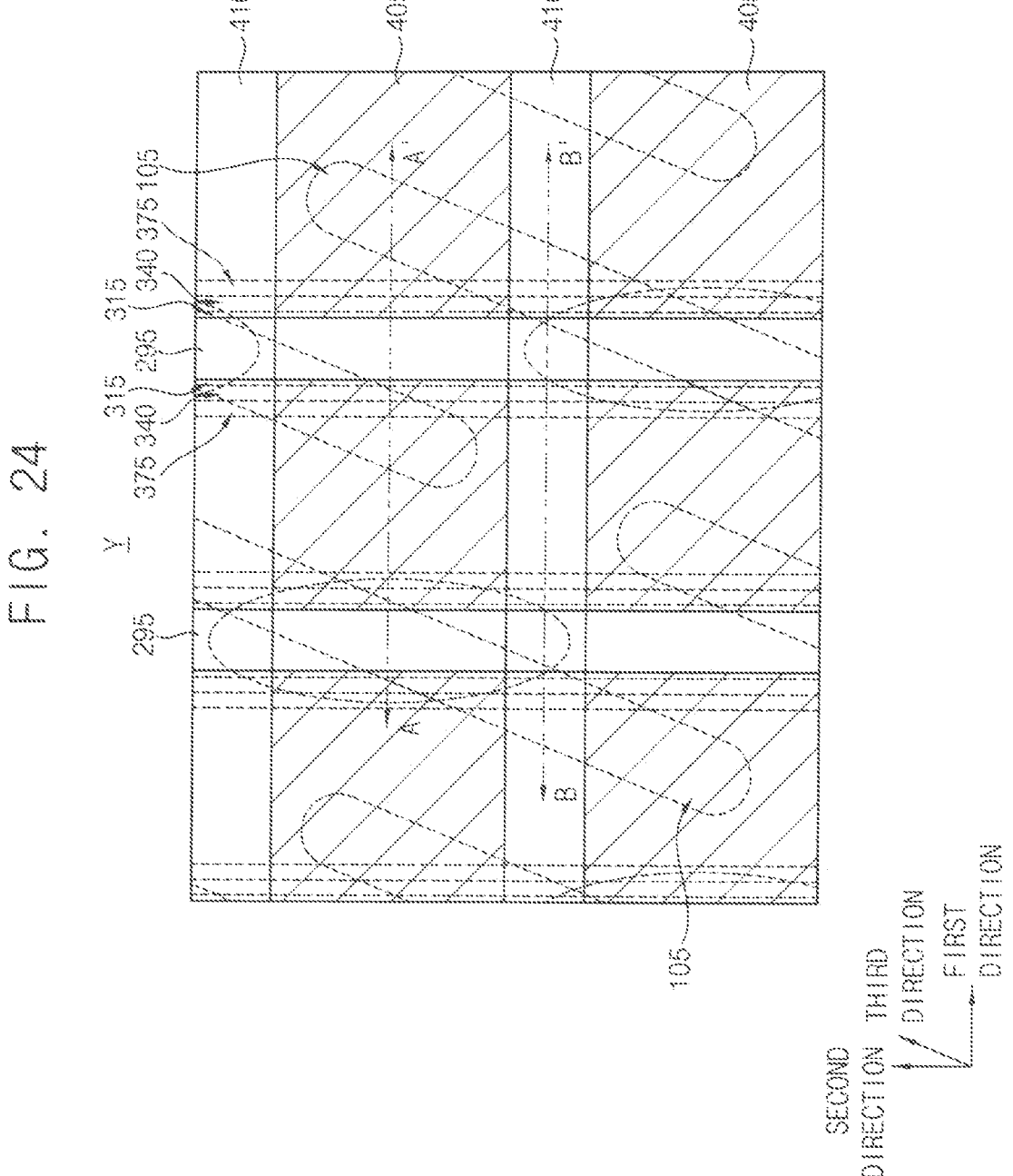
Figure 25:
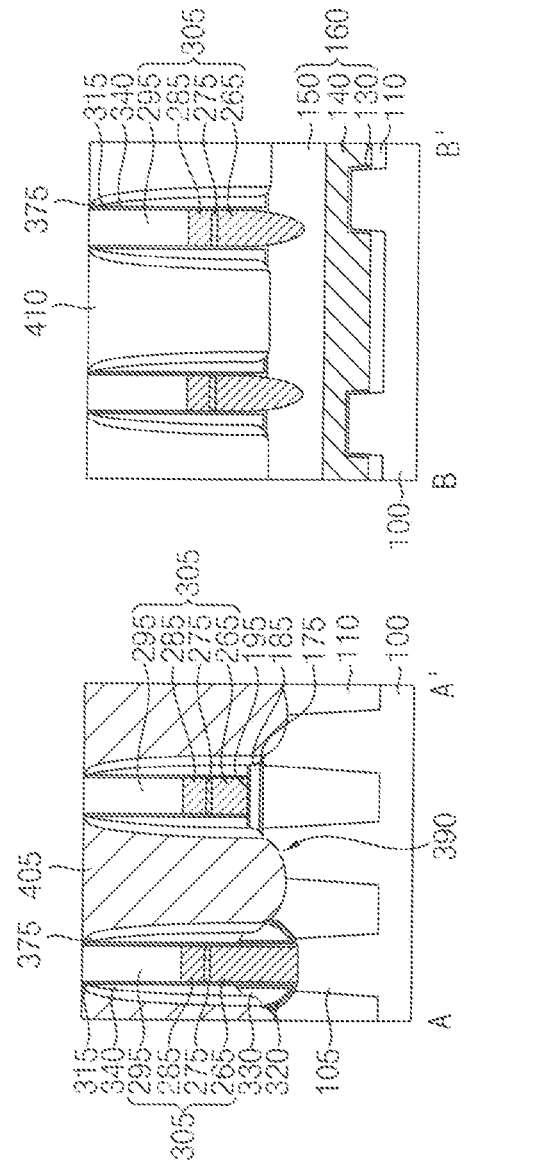

Referring to FIGS. 24 and 25, a second mask having a plurality of fourth openings spaced apart from each other in the second direction, each of which may extend in the first direction, may be formed on the first capping pattern 295 and the lower contact plug 405, and the lower contact plug 405 may be etched using the second mask as an etching mask.

In an example embodiment, each of the fourth openings may overlap the gate structure 160 in the vertical direction. By the etching process, a fifth opening exposing an upper surface of the gate mask 150 of the first gate structure 160 may be formed between the bit line structures 305.

After removing the second mask, a second capping pattern 410 may be formed to fill the fifth opening. The second capping pattern 410 may include a nitride such as silicon nitride. In an example embodiment, a plurality of second capping patterns 410 may be spaced apart from each other in the second direction between the bit line structures 305 neighboring in the first direction.

Thus, the lower contact plug 405 extending in the second direction between the bit line structures 305 may be divided into a plurality of parts spaced apart from each other in the second direction by the second capping patterns 410.

Figure 26:
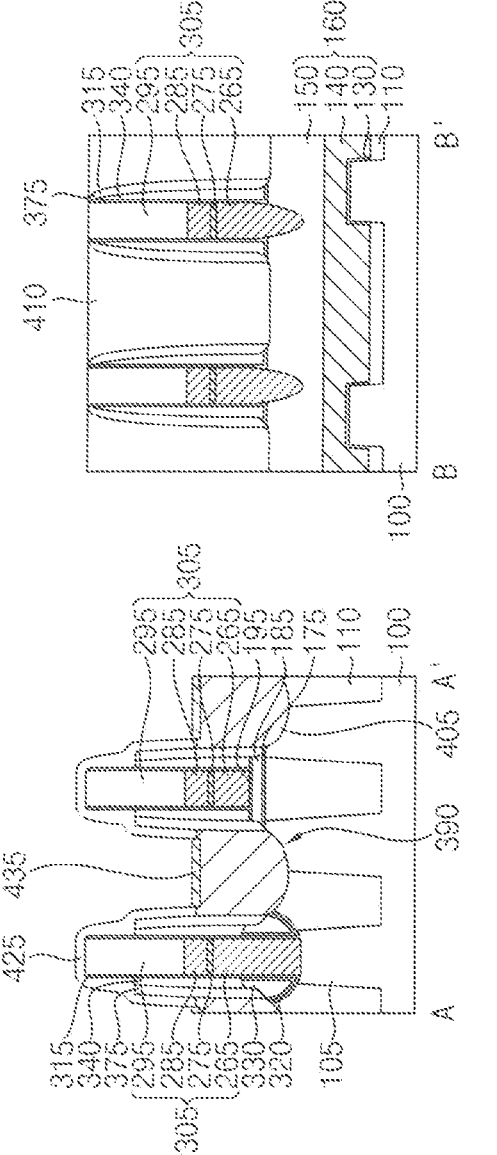

Referring to FIG. 26, an upper portion of the lower contact plug 405 may be removed.

In an example embodiment, the upper portion of the lower contact plug 405 may be removed by an etch back process. As the upper portion of the lower contact plug 405 is removed, an upper portion of the preliminary spacer structure on the sidewall of the bit line structure 305 may be exposed, and upper portions of the second and third spacers 340 and 375 of the exposed preliminary spacer structure may be removed.

An upper portion of the lower contact plug 475 may be removed by, e.g., an etch back process. Thus, an upper surface of the lower contact plug 405 may be lower than uppermost surfaces of the second and third spacers 340 and 375.

A fourth spacer layer may be formed on the bit line structure 305, the preliminary spacer structure, the second capping pattern 410 and the lower contact plug 405, and may be anisotropically etched to form a fourth spacer 425 covering the first to third spacers 315, 340 and 375 on each of opposite sidewalls in the first direction of the bit line structure 305, and an upper surface of the lower contact plug 405 is not covered but exposed by the fourth spacer 425.

A metal silicide pattern 435 may be formed on the exposed upper surface of the lower contact plug 405. In an example embodiment, the metal silicide pattern 435 may be formed by forming a second metal layer on the first and second capping patterns 295 and 410, the fourth spacer 425 and the lower contact plug 405 and thermally treating the second metal layer. An unreacted portion of the second metal layer may be removed. The metal silicide pattern 435 may include, e.g., cobalt silicide, nickel silicide, titanium silicide, etc.

Figure 27:
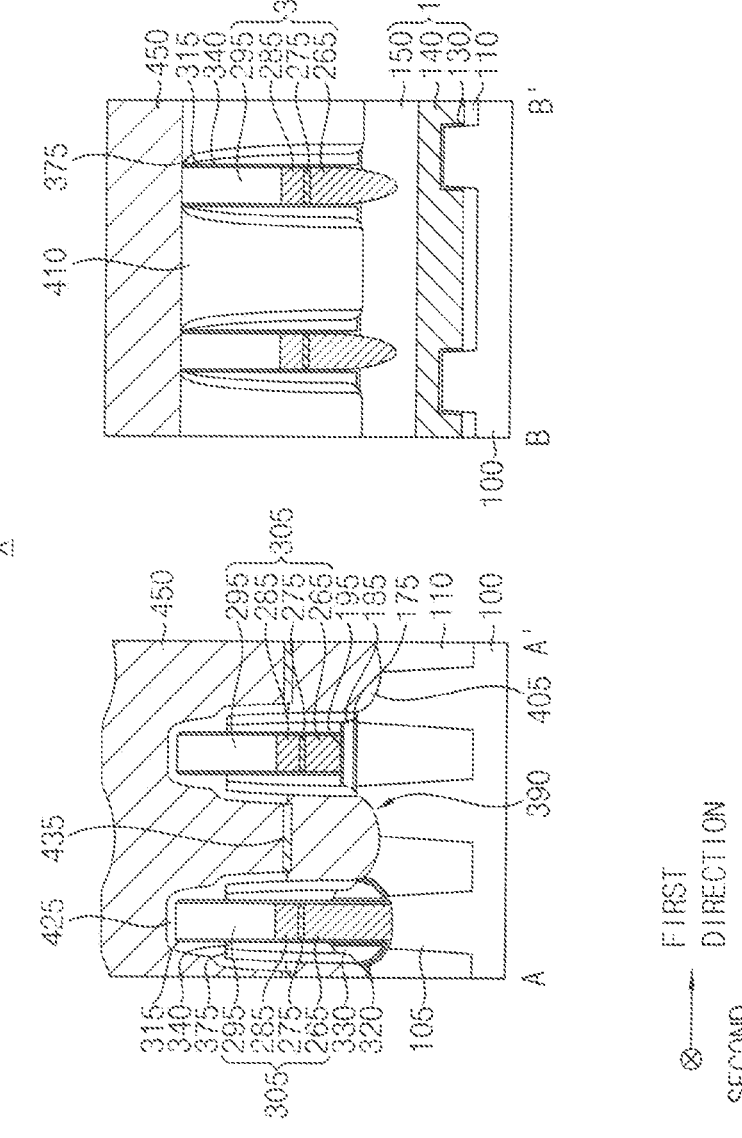

Referring to FIG. 27, an upper contact plug layer 450 may be formed on the first and second capping patterns 295 and 410, the first to fourth spacers 315, 340, 375 and 425, the metal silicide pattern 435 and the lower contact plug 405.

In an example embodiment, the upper contact plug layer 450 may include a metal, e.g., tungsten.

Figure 28:
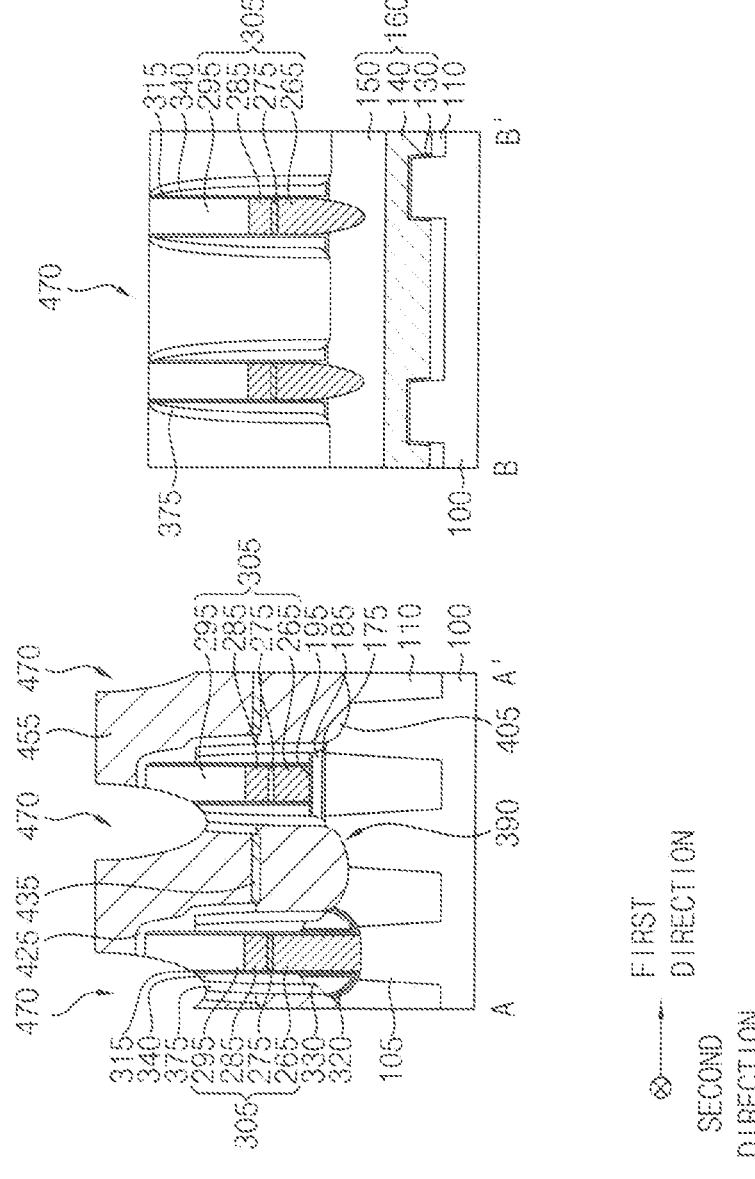

Referring to FIG. 28, an upper portion of the upper contact plug layer 450 may be planarized by a CMP process.

The upper contact plug layer 450 may be partially etched to form a hole 470.

The hole 470 may be formed by removing an upper portion of the upper contact plug layer 450, an upper portion of the first capping pattern 295 and upper portions of the first, third and fourth spacers 315, 375 and 425, and an upper surface of the second spacer 340 may be exposed.

Since the hole 470 is formed, the upper contact plug layer 450 may be transformed into an upper contact plug 455. In an example embodiment, a plurality of upper contact plugs 455 are spaced apart from each other in the first and second directions, and may be arranged in a honeycomb pattern in a plan view. Each of the upper contact plugs 455 may have a shape of a circle, an ellipse, a polygon, etc., in a plan view.

The lower contact plug 405, the metal silicide pattern 435 and the upper contact plug 455 sequentially stacked may form a contact plug structure.

Figure 29:
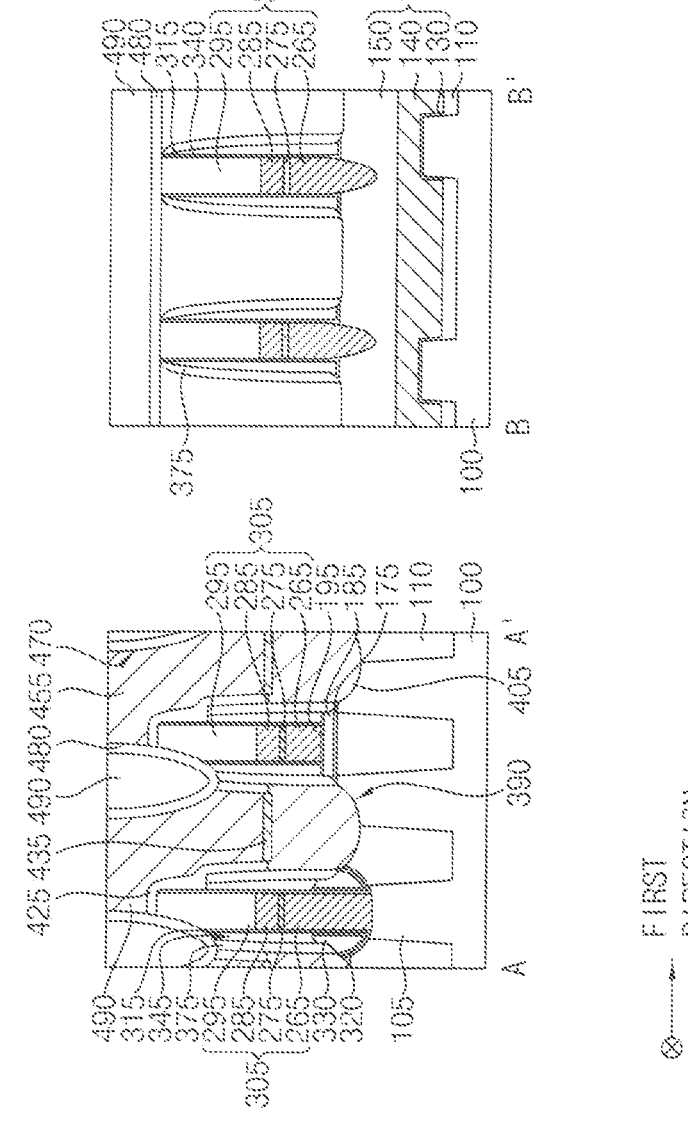

Referring to FIG. 29, the second spacer 340 exposed by the hole 470 may be removed to form an air gap 345 connected to the hole 470. The second spacer 340 may be removed by, e.g., a wet etching process.

In an example embodiment, not only a portion of the second spacer 340 directly exposed by the hole 470 but also a portion of the second spacer 340 parallel to the portion in the horizontal direction may be removed by the wet etching process. That is, not only a portion of the second spacer 340 not covered by the upper contact plug 455, but also a portion of the second spacer 340 covered by the second capping pattern 410 and a portion of the second spacer 340 covered by the upper contact plug 455 may be removed.

First and second insulating interlayers 480 and 490 sequentially stacked may be formed to fill the hole 470. The first and second insulating interlayers 480 and 490 may be sequentially stacked on the second capping pattern 410.

The first insulating interlayer 480 may include a material having poor gap filling characteristic, and thus the air gap 345 under the hole 470 is not filled with the first insulating interlayer 480. The air gap 345 may be referred to as an air spacer 345. The first, third and fourth spacers 315, 375 and 425 and the air spacer 345 may form a spacer structure. The second insulating interlayer 490 may include a nitride such as silicon nitride.

Figure 30:
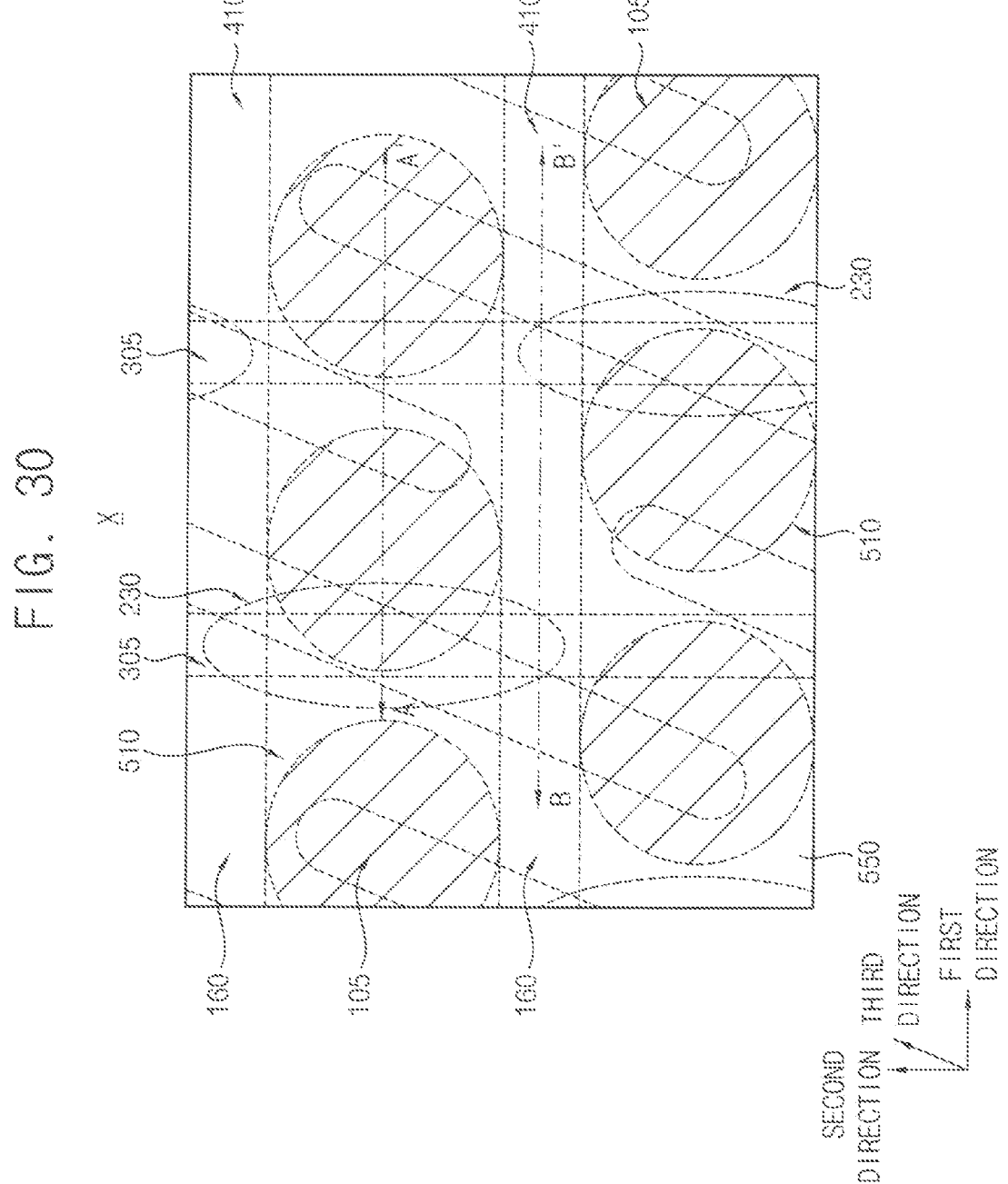
Figure 31:
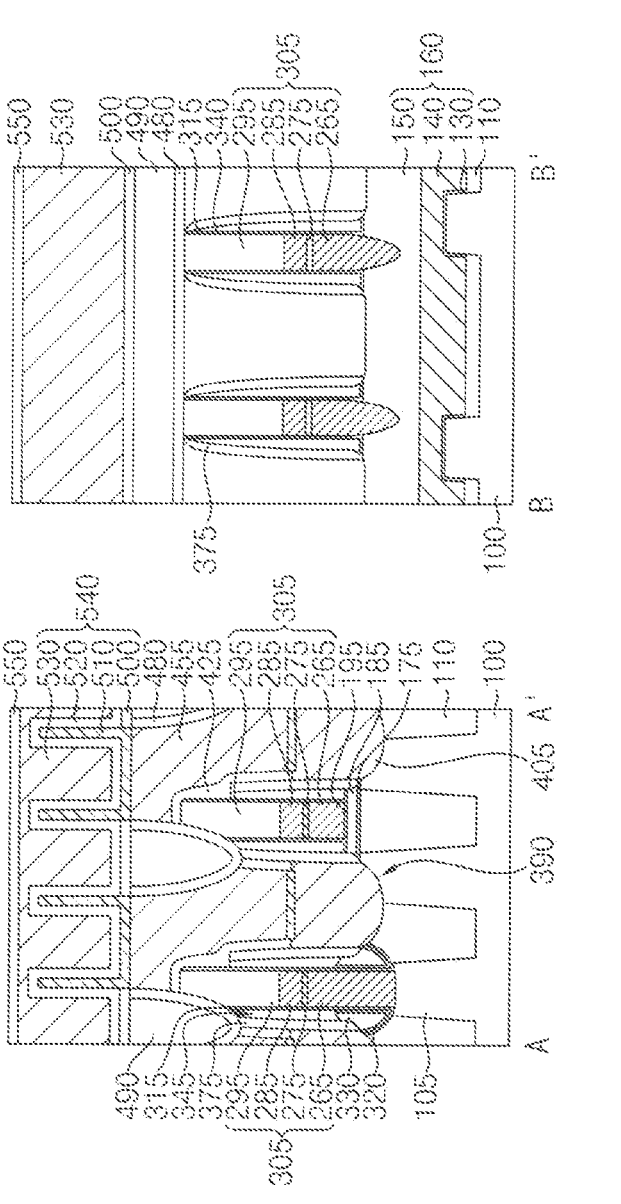

Referring to FIGS. 30 and 31, a capacitor 540 may be formed to contact an upper surface of the upper contact plug 455.

That is, an etch stop layer 500 and a mold layer may be sequentially formed on the upper contact plug 455 and the third and fourth insulating interlayers 480 and 490, and may be partially etched to form a sixth opening partially exposing an upper surface of the upper contact plug 455.

A lower electrode layer may be formed on a sidewall of the sixth opening, the exposed upper surface of the upper contact plug 455 and the mold layer. A sacrificial layer may be formed on the lower electrode layer to fill the sixth opening. The sacrificial layer and the lower electrode layer may be planarized until an upper surface of the mold layer is exposed. The sacrificial layer and the mold layer may be removed by, e.g., a wet etching process, and thus a cylindrical lower electrode 510 may be formed on the exposed upper surface of the upper contact plug 455. Alternatively, a pillar shaped lower electrode 510 may be formed to fill the sixth opening.

A dielectric layer 520 may be formed on a surface of the lower electrode 510 and the etch stop layer 500, and an upper electrode 530 may be formed on the dielectric layer 520 so that the capacitor 540 including the lower electrode 510, the dielectric layer 520 and the upper electrode 530 may be formed.

A third insulating interlayer 550 may be formed to cover the capacitor 540. The third insulating interlayer 550 may include an oxide such as silicon oxide. An upper wiring formed on the third insulating interlayer 550 may be further formed to complete the fabrication of the semiconductor device.

The method of correcting the error of the layout of the pattern, the method of manufacturing the photomask, the method of forming the pattern and the method of manufacturing the semiconductor device using the same may be applied to logic devices such as central processing units (CPUs), microprocessor units (MPUs), application processors (Aps), etc., volatile memory devices such as static random-access memories (SRAMs), dynamic random-access memories (DRAMs), etc., and non-volatile memory devices such as flash memory devices, phase-change random-access memories (PRAMs), magneto-resistive random-access memories (MRAMs), resistive random-access memories (RRAMs), etc.

In an embodiment, the horizontal directions may be replaced with opposing first directions, the vertical directions may be replaced with opposing second directions, where the first directions need not be horizontal, and the second directions need not be vertical. Similarly, the horizontal elements in this embodiment may be replaced with elements in the first directions and the vertical elements may be replaced with elements in the second directions.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of correcting an error of a layout of a pattern, the method comprising:
   designing a layout of a target pattern;
   checking an error between the layout of the target pattern and a layout of a real pattern in a photomask manufactured based on the layout of the target pattern;

generating edge placement error (EPE) vectors at a plurality of points, respectively, in a contour of the layout of the target pattern;
   calculating horizontal and vertical elements in horizontal and vertical directions, respectively, of each of the generated EPE vectors;
   calculating an offset representative value of the layout of the target pattern at each of the directions based on the calculated horizontal and vertical elements of the EPE vectors; and
   correcting the layout of the target pattern based on the offset representative value.

2. The method according to claim 1, wherein generating the EPE vectors at the plurality of points, respectively, comprises:
   selecting the plurality of points included in the contour of the layout of the target pattern and spaced apart from each other by a given distance; and
   generating a normal vector at each of the plurality of points, the normal vector being perpendicular to a tangential line at a corresponding one of the plurality of points and having a direction toward the layout of the real pattern.

3. The method according to claim 2, wherein a magnitude of the normal vector is a distance from each of the plurality of points to the contour of the layout of the real pattern in a direction of the normal vector.

4. The method according to claim 3, wherein a magnitude of the horizontal element of each of the EPE vectors is a magnitude of the normal vector multiplied by a cosine of an angle between the normal vector and the horizontal direction, and
   wherein a magnitude of the vertical element of each of the EPE vectors is a magnitude of the normal vector multiplied by a sine of the angle between the normal vector and the horizontal direction.

5. The method according to claim 4, wherein the offset representative value of the layout of the target pattern at each direction includes an offset representative value in a right direction, an offset representative value in a left direction, an offset representative value in an upward direction and an offset representative value in a downward direction.

6. The method according to claim 5, wherein the offset representative value of the layout of the target pattern at each direction is a mean value of magnitudes of the EPE vectors in the corresponding direction.

7. The method according to claim 5, wherein correcting the layout of the target pattern based on the offset representative value comprises sequentially correcting the layout of the target pattern in a given order among the right direction, the left direction, the upward direction and the downward direction.

8. A method of manufacturing a photomask, the method comprising:
   designing a layout of a pattern;
   performing an optical proximity correction (OPC) on the layout of the pattern to generate a first corrected layout;
   manufacturing a first photomask based on the first corrected layout;
   checking an error between the first corrected layout and a layout of a real pattern in the first photomask;
   correcting the first corrected layout based on a result of the checking to generate a second corrected layout; and
   manufacturing a second photomask based on the second corrected layout,
   wherein the correcting comprises:

generating edge placement error (EPE) vectors at a plurality of points, respectively, in a contour of the first corrected layout;

calculating horizontal and vertical elements in horizontal and vertical directions, respectively, of each of the generated EPE vectors;

calculating an offset representative value of the layout of the pattern at each direction based on the calculated horizontal and vertical elements of the EPE vectors; and correcting the first corrected layout of the pattern based on the offset representative value.

9. The method according to claim 8, further comprising, prior to manufacturing the first photomask, correcting the first corrected layout based on data generated from correcting a layout of another pattern that has substantially a same shape as the pattern.

10. The method according to claim 8, further comprising, after correcting the first corrected layout of the pattern, a performing a mask rule check (MRC) on the second corrected layout of the pattern.

11. The method according to claim 8, wherein generating the EPE vectors at the plurality of points, respectively, comprises:

selecting the plurality of points included in the contour of the layout of the pattern and spaced apart from each other by a given distance; and generating a normal vector at each of the plurality of points, the normal vector being perpendicular to a tangential line at a corresponding one of the plurality of points and having a direction toward the layout of the real pattern.

12. The method according to claim 11, wherein a magnitude of the normal vector is a distance from each of the plurality of points to the contour of the layout of the real pattern in a direction of the normal vector.

13. The method according to claim 12, wherein a magnitude of the horizontal element of each of the EPE vectors is a magnitude of the normal vector multiplied by a cosine of an angle between the normal vector and the horizontal direction, and wherein a magnitude of the vertical element of each of the EPE vectors is a magnitude of the normal vector multiplied by a sine of the angle between the normal vector and the horizontal direction.

14. The method according to claim 13, wherein the offset representative value of the layout of the pattern at each direction includes an offset representative value in a right direction, an offset representative value in a left direction, an offset representative value in an upward direction and an offset representative value in a downward direction.

15. The method according to claim 14, wherein the offset representative value of the layout of the pattern at each direction is a mean value of magnitudes of the EPE vectors in the corresponding direction.

16. The method according to claim 14, wherein correcting the layout of the pattern based on the offset representative value includes sequentially correcting the layout of the pattern in a given order among the right direction, the left direction, the upward direction and the downward direction.

17. A method of forming a pattern, the method comprising:

designing a layout of the pattern;

performing an optical proximity correction (OPC) on the layout of the pattern to generate a first corrected layout;

manufacturing a first photomask based on the first corrected layout;

checking an error between the first corrected layout and a layout of a real pattern in the first photomask;

correcting the first corrected layout using a result of the checking to generate a second corrected layout;

manufacturing a second photomask based on the second corrected layout; and patterning an etching object layer on a substrate using the second photomask to form the pattern on the substrate, wherein the correcting comprises:

generating edge placement error (EPE) vectors at a plurality of points, respectively, in a contour of the first corrected layout of the pattern;

calculating horizontal and vertical elements in horizontal and vertical directions, respectively, of each of the generated EPE vectors;

calculating an offset representative value of the layout of the pattern at each direction based on the calculated horizontal and vertical elements of the EPE vectors; and correcting the first corrected layout of the pattern based on the offset representative value.

18. The method according to claim 17, wherein patterning the etching object layer on the substrate using the second photomask to form the pattern on the substrate comprises:

forming a photoresist layer on the etching object layer;

performing an exposure process on the photoresist layer using the second photomask;

performing a developing process on the photoresist layer to form a photoresist pattern; and performing an etching process using the photoresist pattern as an etching mask.

19. The method according to claim 17, wherein generating the EPE vectors at the plurality of points, respectively, comprises:

selecting the plurality of points included in the contour of the layout of the pattern and spaced apart from each other by a given distance; and generating a normal vector at each of the plurality of points, the normal vector being perpendicular to a tangential line at a corresponding one of the plurality of points and having a direction toward the layout of the real pattern.

20. The method according to claim 19, wherein:

a magnitude of the normal vector is a distance from each of the plurality of points to the contour of the layout of the real pattern in a direction of the normal vector, a magnitude of the horizontal element of each of the EPE vectors is a magnitude of the normal vector multiplied by a cosine of an angle between the normal vector and the horizontal direction, and a magnitude of the vertical element of each of the EPE vectors is a magnitude of the normal vector multiplied by a sine of the angle between the normal vector and the horizontal direction.

* * * * *